US009362285B2

(12) United States Patent
Basker et al.

(10) Patent No.: US 9,362,285 B2
(45) Date of Patent: Jun. 7, 2016

(54) STRUCTURE AND METHOD TO INCREASE CONTACT AREA IN UNMERGED EPI INTEGRATION FOR CMOS FINFETS

(71) Applicant: International Business Machines Corporation, Armonk, NY (US)

(72) Inventors: Veeraraghavan S. Basker, Schenectady, NY (US); Kangguo Cheng, Schenectady, NY (US); Ali Khakifirooz, Los Altos, CA (US)

(73) Assignee: INTERNATIONAL BUSINESS MACHINES CORPORATION, Armonk, NY (US)

( * ) Notice: Subject to any disclaimer, the term of this patent is extended or adjusted under 35 U.S.C. 154(b) by 0 days.

(21) Appl. No.: 14/505,000

(22) Filed: Oct. 2, 2014

(65) Prior Publication Data

US 2016/0099246 A1    Apr. 7, 2016

(51) Int. Cl.
*H01L 29/78* (2006.01)
*H01L 27/092* (2006.01)
*H01L 21/8238* (2006.01)
*H01L 21/225* (2006.01)
*H01L 29/161* (2006.01)
*H01L 23/528* (2006.01)
*H01L 23/532* (2006.01)

(52) U.S. Cl.
CPC ........ *H01L 27/0924* (2013.01); *H01L 21/2251* (2013.01); *H01L 21/823814* (2013.01); *H01L 21/823821* (2013.01); *H01L 21/823871* (2013.01); *H01L 23/528* (2013.01); *H01L 23/53209* (2013.01); *H01L 27/0922* (2013.01); *H01L 29/161* (2013.01)

(58) Field of Classification Search
CPC ................... H01L 21/8238; H01L 21/823821; H01L 27/092; H01L 27/0924; H01L 29/78; H01L 29/785; H01L 29/0847; H01L 29/7853; H01L 29/1095; H01L 29/66795
See application file for complete search history.

(56) References Cited

U.S. PATENT DOCUMENTS

| 7,001,783 | B2 | 2/2006 | Costrini et al. |
| 8,120,119 | B2 | 2/2012 | Fischer et al. |
| 8,361,851 | B2 | 1/2013 | Zhu et al. |
| 8,476,168 | B2 | 7/2013 | Graves-Abe et al. |
| 2007/0001219 | A1 | 1/2007 | Radosavljevic et al. |
| 2014/0110784 | A1 | 4/2014 | Jagannathan et al. |
| 2014/0159159 | A1* | 6/2014 | Steigerwald ...... H01L 29/66795 257/369 |
| 2015/0024558 | A1* | 1/2015 | Basker .............. H01L 29/66659 438/151 |

(Continued)

*Primary Examiner* — Tan N Tran
*Assistant Examiner* — Fazli Erdem
(74) *Attorney, Agent, or Firm* — Scully, Scott, Murphy & Presser, P.C.; Steven J. Meyers

(57) ABSTRACT

Source/drain contact structures with increased contact areas for a multiple fin-based complementary metal oxide semiconductor field effect transistor (CMOSFET) having unmerged epitaxial source/drain regions and methods for forming such source/drain contact structures are provided by forming wrap-around source/drain contact structures for both n-type FinFETs and p-type FinFETs. Each of first source/drain contact structures for the n-type FinFETs includes at least one first conductive plug encapsulating epitaxial first source/drain regions on one side of a gate structure, while each of second source/drain contact structures for the p-type FinFETs includes at least a contact metal layer portion encapsulating epitaxial second source/drain regions on one side of the gate structure, and a second conductive plug located over a top surface of the contact metal layer portion.

7 Claims, 18 Drawing Sheets

(56) References Cited

U.S. PATENT DOCUMENTS

| | | | |
|---|---|---|---|
| 2015/0035086 A1* | 2/2015 | Xie | H01L 29/66545 257/411 |
| 2015/0064892 A1* | 3/2015 | Leobandung | H01L 21/28008 438/586 |
| 2015/0129934 A1* | 5/2015 | Xie | H01L 27/0886 257/192 |
| 2015/0129988 A1* | 5/2015 | Leobandung | H01L 29/6681 257/410 |
| 2015/0137181 A1* | 5/2015 | Basker | H01L 27/0924 257/192 |
| 2015/0214059 A1* | 7/2015 | Bouche | H01L 21/2807 257/369 |
| 2015/0263128 A1* | 9/2015 | Basker | H01L 29/785 257/288 |

* cited by examiner

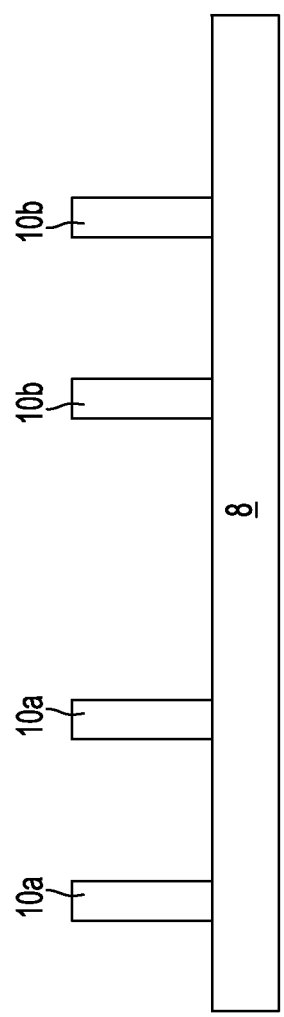

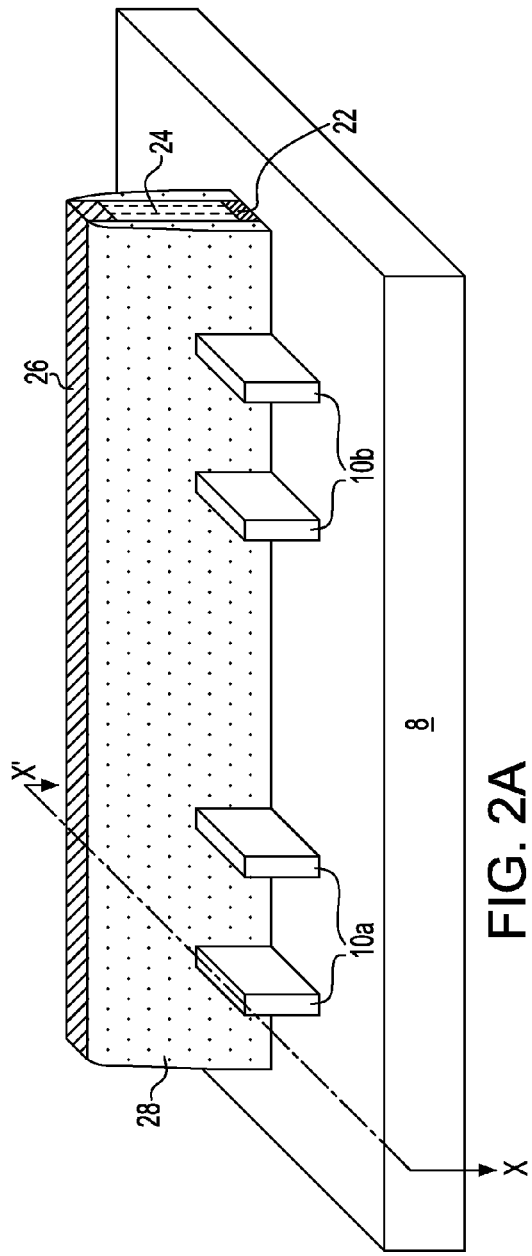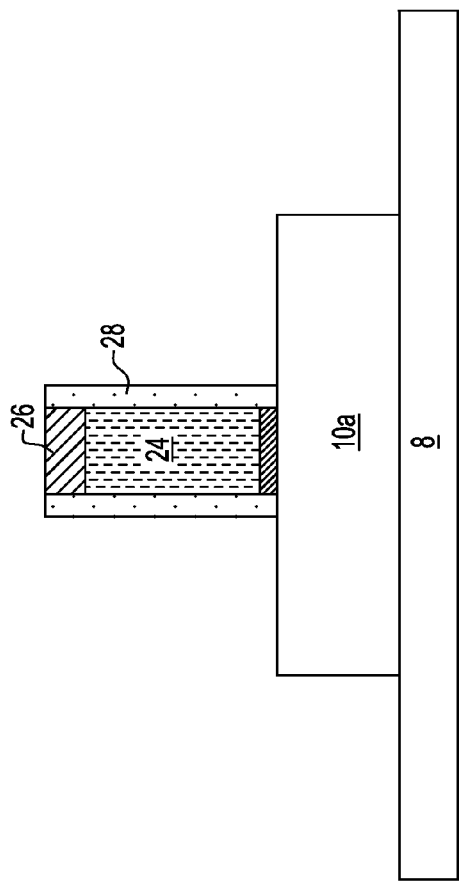
FIG. 2A
FIG. 2B

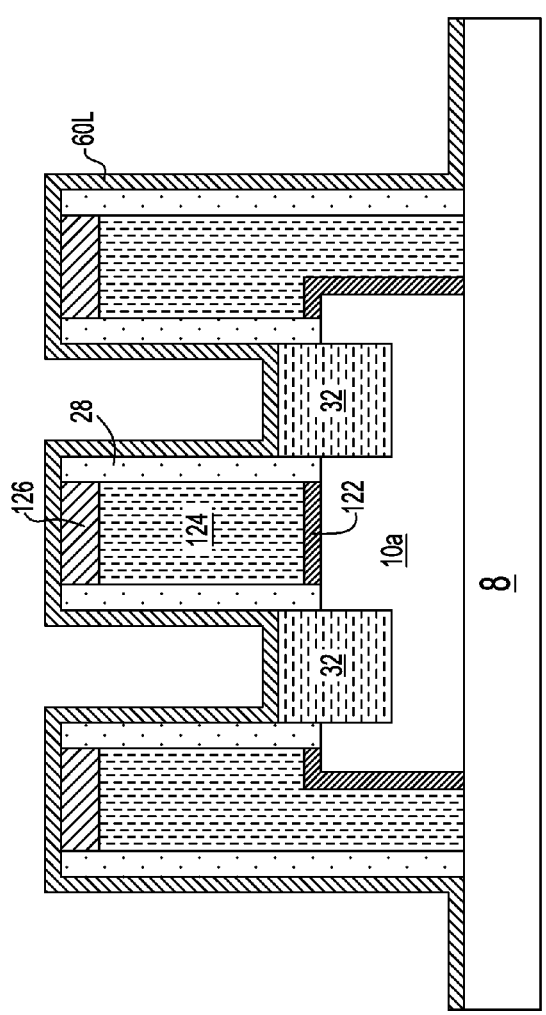
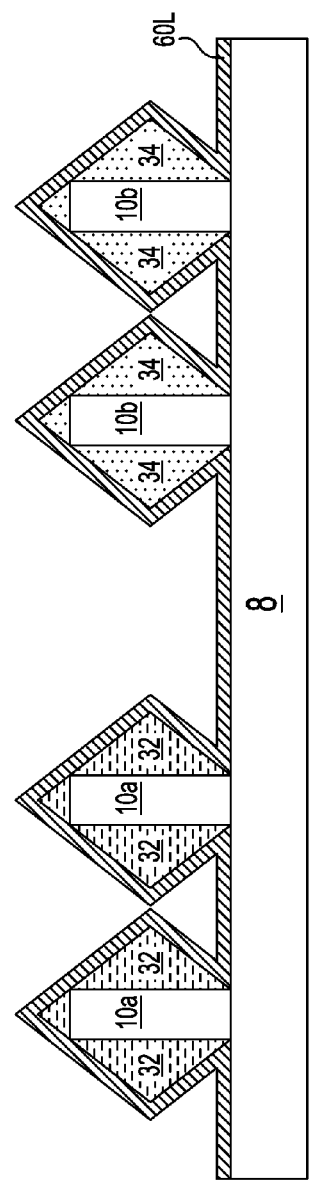
FIG. 11A
FIG. 11B

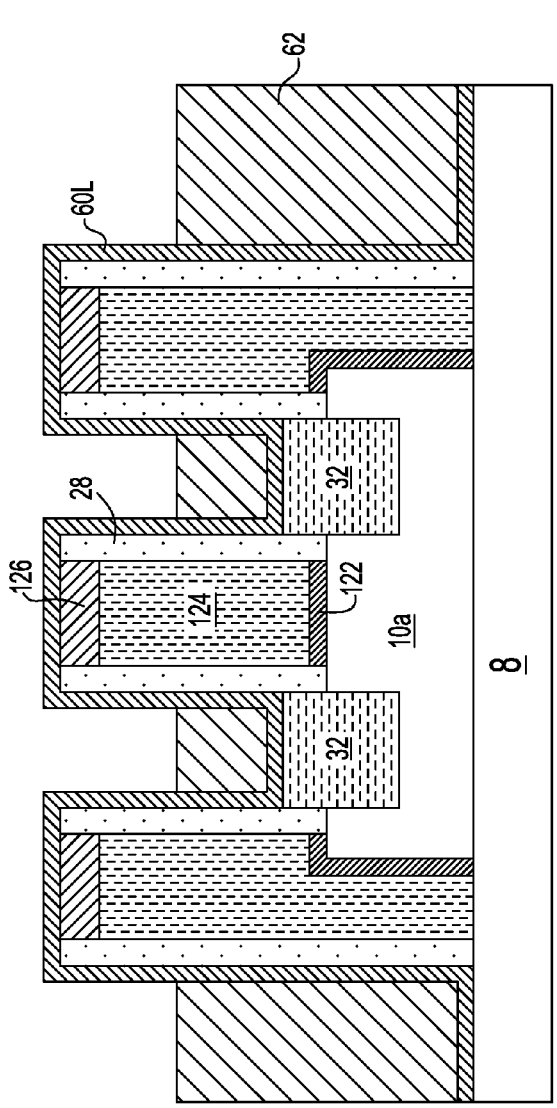
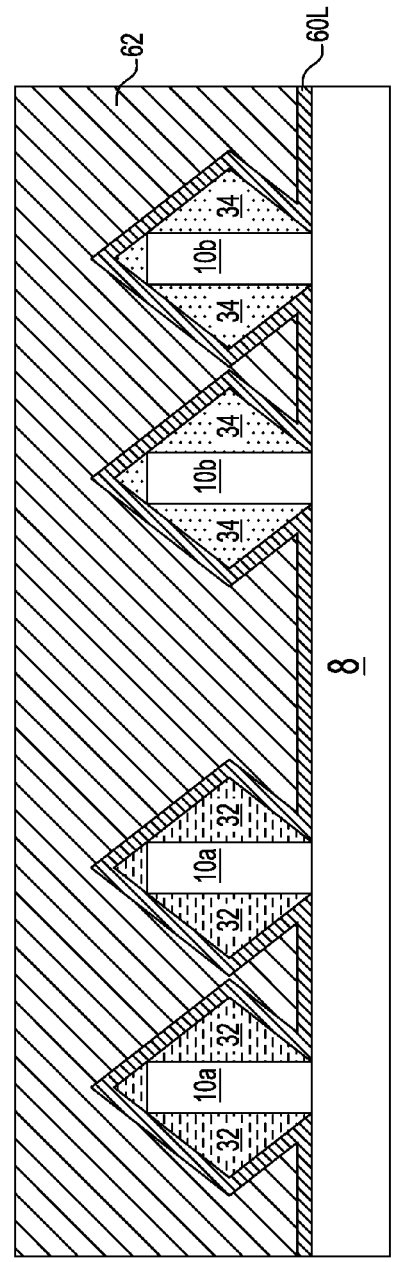

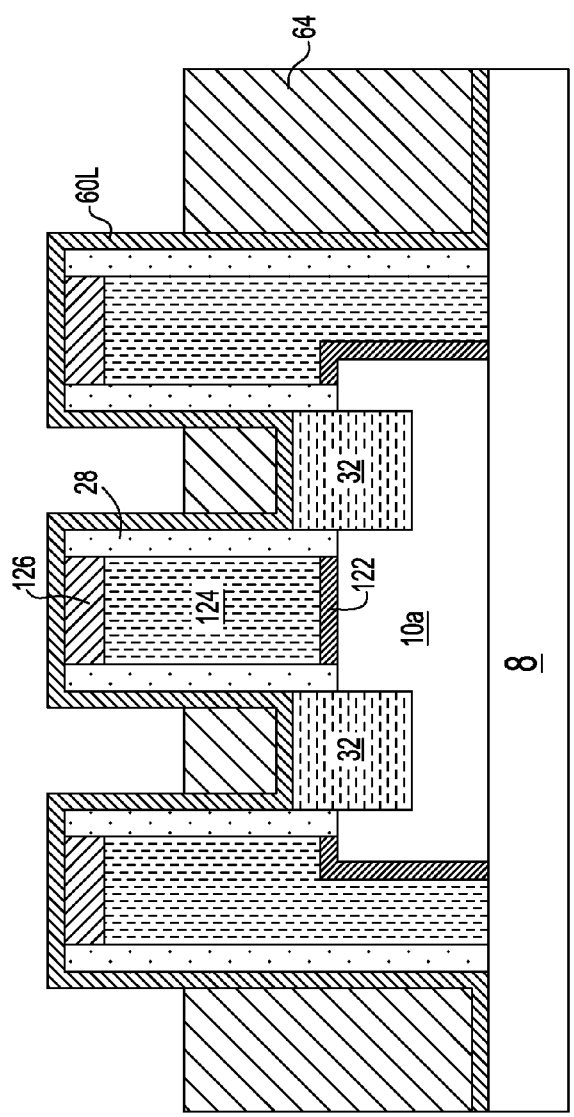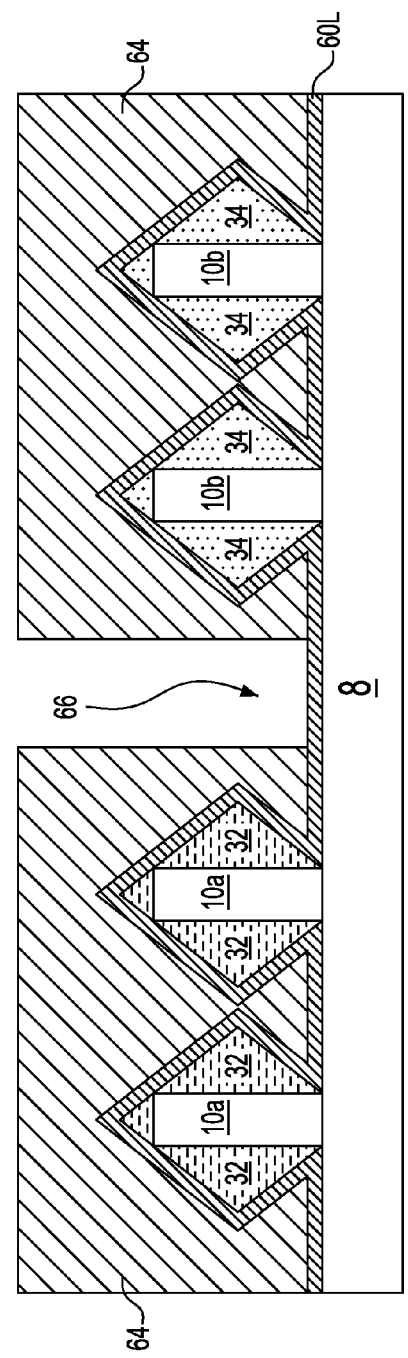
FIG. 13A
FIG. 13B

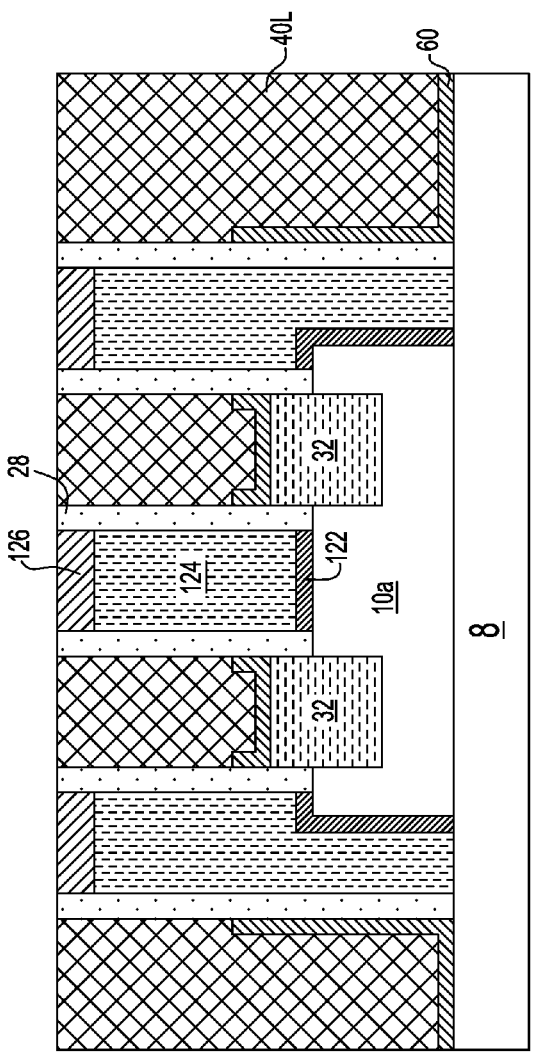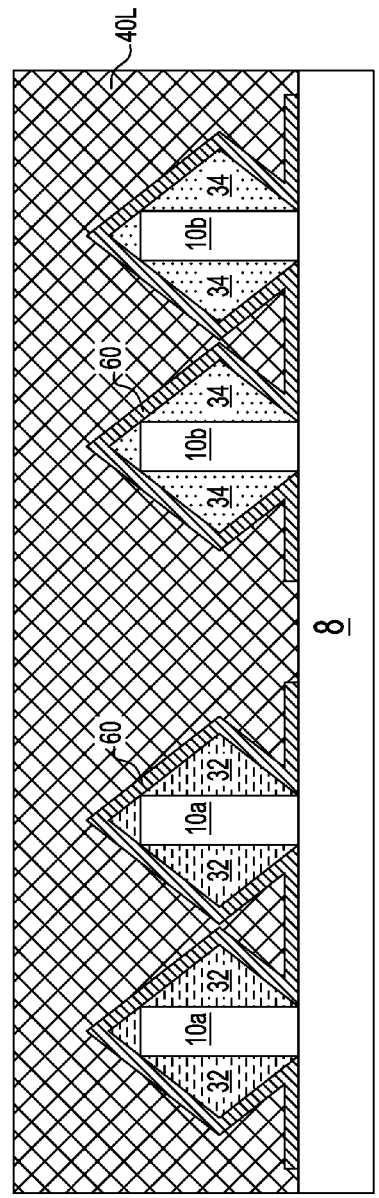

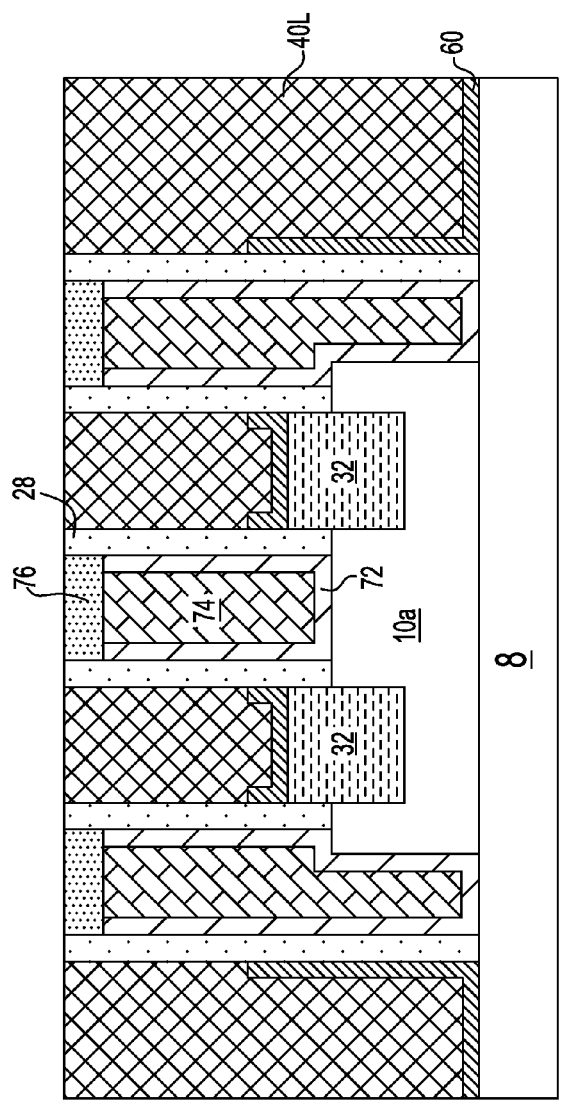
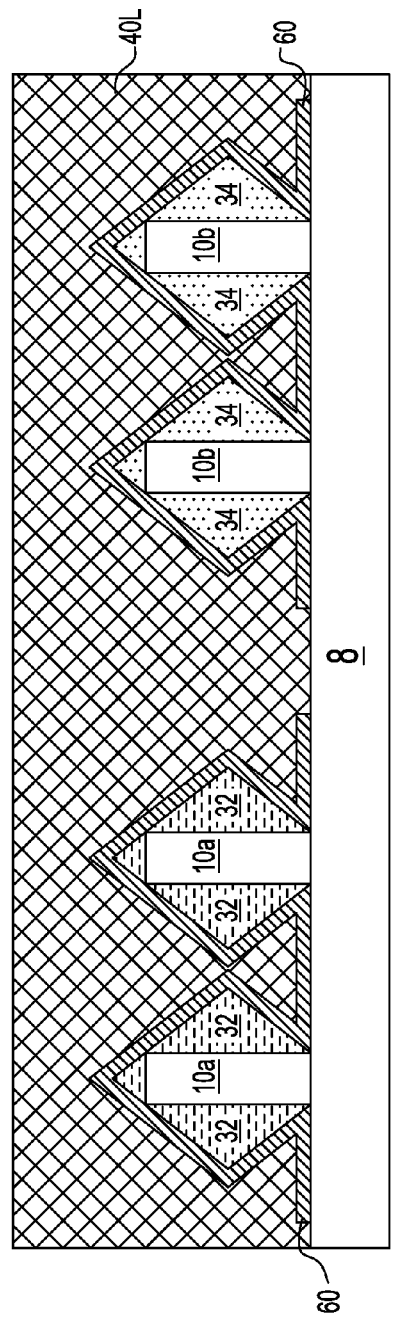

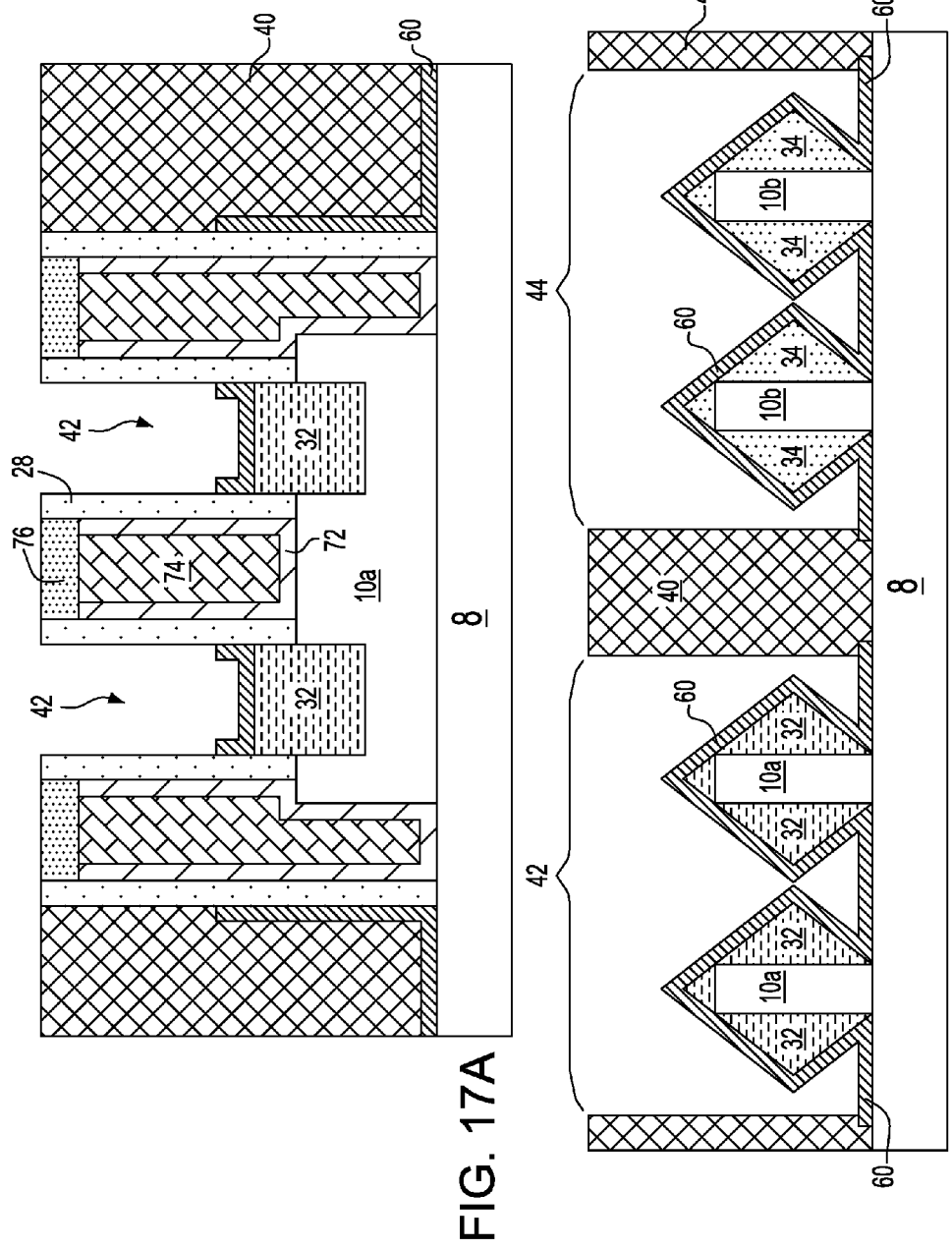

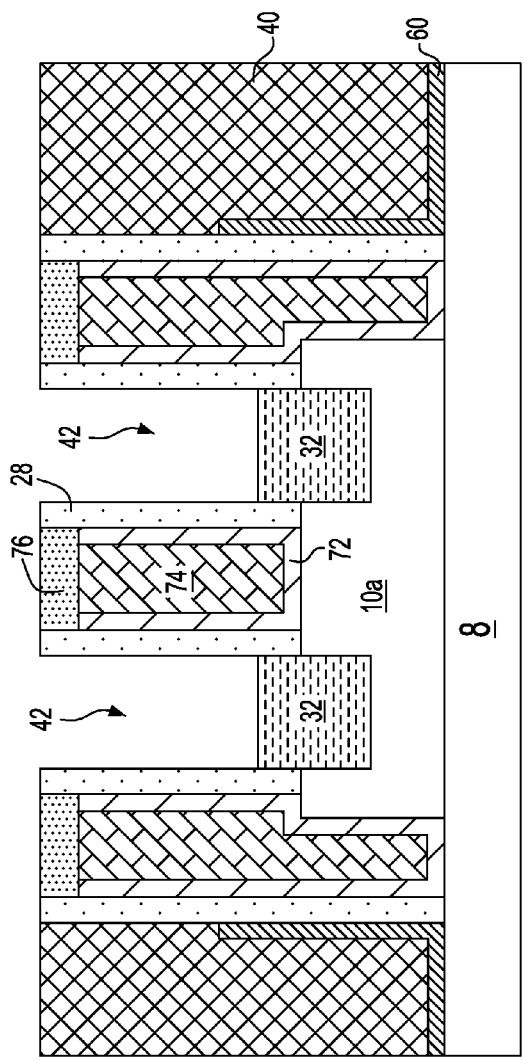
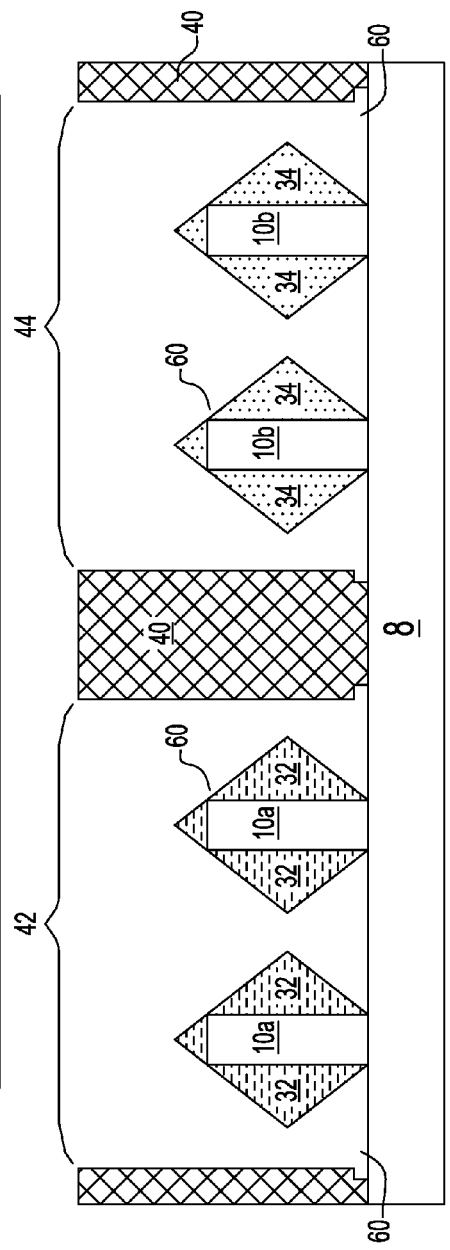
FIG. 18A
FIG. 18B

STRUCTURE AND METHOD TO INCREASE CONTACT AREA IN UNMERGED EPI INTEGRATION FOR CMOS FINFETS

BACKGROUND

The present application relates to semiconductor devices and, more particularly to a source contact structure and a drain contact structure in fin-based complementary metal oxide semiconductor field effect transistors having unmerged epitaxial source region and an unmerged epitaxial drain region.

As integrated circuits continue to scale downward in size, fin field effect transistors (FinFETs) are becoming increasingly attractive to be used in smaller nodes, e.g., 22 nm node and beyond. Use of multiple fins with an unmerged epitaxial source region and an unmerged epitaxial drain region (hereinafter collectively referred to as "unmerged epitaxial source/drain regions) enables further tailoring of device specification and increased performed. However, with unmerged epitaxial source/drain regions, there is significant loss of contact area since the source contact and the drain contact (hereinafter collectively referred to as source/drain contacts) are typically formed over top portions of the epitaxial source/drain regions and most of the epitaxial source/drain regions are covered by an interlayer dielectric layer (ILD) layer through which the source/drain contacts are formed. The limited contact area can lead to high source/drain contact resistance which in turn degrades device performance. Therefore, there remains a need to improve source/drain contact area for multiple fin FETs with unmerged epitaxial source/drain regions.

Moreover, in a typical process for forming source/drain contacts, contact openings are first etched through the ILD layer and the contact openings are subsequently filled with a metal to form electrical contacts that are in direct contact with the epitaxial source/drain regions. When using an anisotropic etch to form the contact openings, an over-etch is typically performed in order to remove the dielectric material of the ILD layer completely from surfaces of the epitaxial source/drain regions. This over-etch may damage the epitaxial source/drain regions, especially when a silicon germanium alloy (i.e., SiGe) with a high Ge content is employed to form the epitaxial source/drain regions. Therefore, there remains a need to protect the epitaxial source/drain regions during the etch process in forming the source/drain contact openings.

SUMMARY

The present application provides source/drain contact structures with increased contact areas for a multiple fin-based complementary metal oxide semiconductor field effect transistor (CMOSFET) having unmerged epitaxial source/drain regions and methods for forming such source/drain contact structures.

In one aspect of the present application, a method of forming a semiconductor structure is provided. The method includes first forming at least one gate structure over a channel portion of each of a plurality of first semiconductor fins and a plurality of second semiconductor fins. A first semiconductor material is epitaxially grown on portions of each of the plurality of first semiconductor fins that are not covered by the at least one gate structure to provide first epitaxial source/drain regions. Adjacent first epitaxial source/drain regions are separated by a first gap. Next, a second semiconductor material is epitaxially grown on portions of each of the plurality of second semiconductor fins that is not covered by the at least one gate structure to provide second epitaxial source/drain regions. Adjacent second epitaxial source/drain regions are separated by a second gap. After forming an interlevel dielectric (ILD) layer over the substrate to cover the at least one gate structure, the first epitaxial source/drain regions and the second epitaxial source/drain regions, a pair of first source/drain contact openings and a pair of second source source/drain contact openings are formed through the ILD layer on the opposite sides of the gate structure. Each of the first source/drain contact openings exposes an entirety of the first epitaxial source/drain regions on one side of the gate structure, and each of the second source/drain contact openings exposes an entirety of the second epitaxial source/drain regions on one side of the gate structure. Next, first contact metal layer portions are formed within the first source/drain contact openings and second contact metal layer portions are formed within the second source/drain contact openings. The first contact metal layer portions completely fill each first gap between the adjacent first epitaxial source/drain regions, and the second contact metal layer portions completely fill each second gap between the adjacent second epitaxial source/drain regions. The first contact metal layer portions are then removed to re-expose first epitaxial source/drain regions in the first source/drain contact openings. Next, a contact liner layer is formed on exposed surfaces of the first source/drain contact openings, the first epitaxial source/drain regions, the second epitaxial source/drain contact openings and the second contact metal layer portions. Portions of the contact liner layer in the first source/drain contact openings conform to the exposed surfaces of the first epitaxial source/drain regions. A conductive fill layer within the first source/drain contact openings and the second source/drain contact openings is then formed to fill a remaining volume of each of the first source/drain contact openings and the second source/drain contact openings.

In another aspect of the present application, a semiconductor structure is provided. The semiconductor structure includes a plurality of first semiconductor fins located on a first region of a substrate and a plurality of second semiconductor fins located a second region of the substrate. Each of the plurality of first semiconductor fins has a channel region disposed between a pair of first epitaxial source/drain regions, and adjacent first epitaxial source/drain regions are separated by a first gap. Each of the plurality of second semiconductor fins has a channel region disposed between a pair of second epitaxial source/drain regions, and adjacent epitaxial second source/drain regions are separated by a second gap. The semiconductor structure further includes a gate structure overlying the channel portion of each of the plurality of first semiconductor fins and the plurality of second semiconductor fins, a pair of first source/drain contact structures electrically coupled to the first epitaxial source/drain regions located on either side of the gate structure, and a pair of second source/drain contact structures electrically coupled to the second epitaxial source/drain regions located on either side of the gate structure. Each of the first source/drain contact structures includes at least a first conductive encapsulating the first epitaxial source/drain regions on one side of the gate structure and in contact with all surfaces of the epitaxial first source/drain regions, and each of the second source/drain contact structures includes at least a contact metal layer portion encapsulating the second epitaxial source/drain regions on one side of the gate structure and in contact with all surfaces of the second epitaxial source/drain regions and a second conductive plug located on a top surface of the contact metal layer portion.

BRIEF DESCRIPTION OF THE DRAWINGS

FIG. 1 is a cross-sectional view of an exemplary semiconductor structure including a plurality of first semiconductor fins for a first conductivity semiconductor device and a plurality of second semiconductor fins for a second conductivity semiconductor device formed on a substrate in accordance with an embodiment of present application.

FIG. 2A is a perspective view of the exemplary semiconductor structure of FIG. 1 after forming a gate structure over a channel portion of each of the plurality of first semiconductor fins and the plurality of second semiconductor fins.

FIG. 2B is a cross-sectional view of the exemplary semiconductor structure of FIG. 2A along line x-x'.

FIG. 11A is a cross-sectional view of the exemplary semiconductor structure of FIG. 3A along line x-x' after forming a nitride cap layer on exposed surfaces of the gate structures, the first epitaxial source/drain regions, the second epitaxial source/drain regions and the substrate.

FIG. 11B is a cross-sectional view of the exemplary semiconductor structure of FIG. 3A along line y-y' after forming a nitride cap layer on exposed surfaces of sacrificial gate structures, the first epitaxial source/drain regions, the second epitaxial source/drain regions and the substrate.

FIGS. 12A-12B are cross-sectional views of the exemplary semiconductor structure of FIGS. 11A-11B after forming organic planarization layer (OPL) portions.

FIGS. 13A-13B are cross-sectional views of the exemplary semiconductor structure of FIGS. 12A-12B after forming gaps between the first epitaxial source/drain regions and the second epitaxial source/drain regions.

FIGS. 15A-15B are cross-sectional views of the exemplary semiconductor structure of FIGS. 14A-14B after forming an ILD layer.

FIGS. 16A-16B are cross-sectional views of the exemplary semiconductor structure of FIGS. 15A-15B after forming functional gate structures.

FIGS. 17A-17B are cross-sectional views of the exemplary semiconductor structure of FIGS. 16A-16B after forming first source/drain contact openings and second source/drain contact openings through the ILD layer.

FIGS. 18A-18B are cross-sectional views of the exemplary semiconductor structure of FIGS. 17A-17B after removing portions of the nitride cap layer portions that are exposed in the first and second source/drain contact openings.

DETAILED DESCRIPTION

Figure 3A:
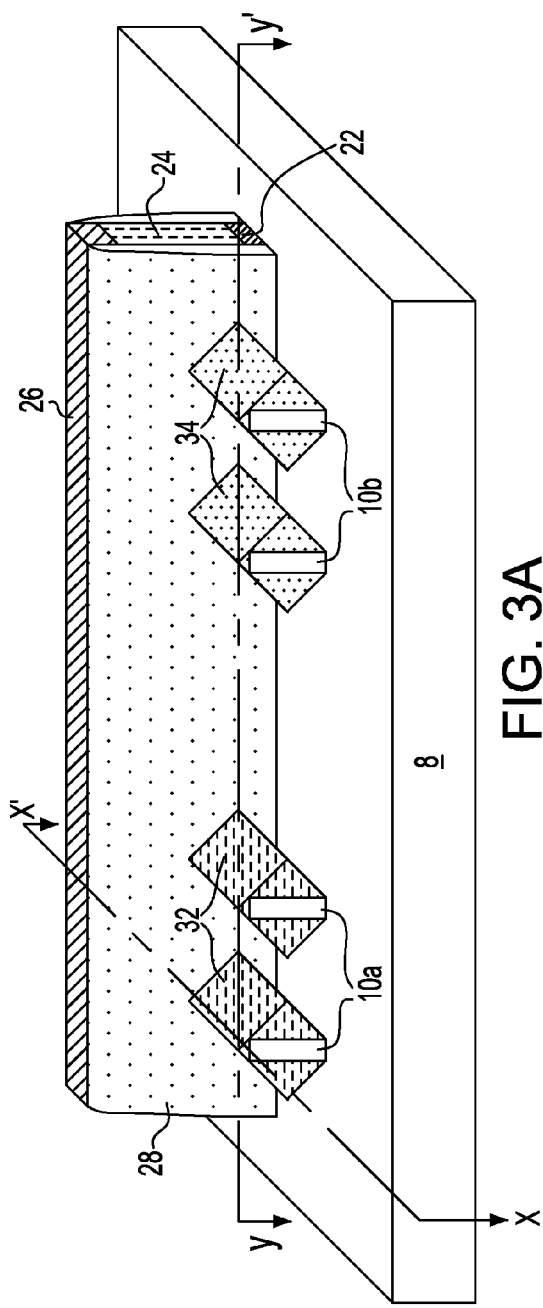
FIG. 3A is a perspective view of the exemplary semiconductor structure of FIGS. 2A-2B after forming first epitaxial source/drain regions and second epitaxial source/drain regions.

The present application will now be described in greater detail by referring to the following discussion and drawings that accompany the present application. It is noted that the drawings of the present application are provided for illustrative purposes only and, as such, the drawings are not drawn to scale. It is also noted that like and corresponding elements are referred to by like reference numerals.

In the following description, numerous specific details are set forth, such as particular structures, components, materials, dimensions, processing steps and techniques, in order to provide an understanding of the various embodiments of the present application. However, it will be appreciated by one of ordinary skill in the art that the various embodiments of the present application may be practiced without these specific details. In other instances, well-known structures or processing steps have not been described in detail in order to avoid obscuring the present application.

Referring to FIG. 1, there is illustrated an exemplary semiconductor structure that can be employed according to an embodiment of the present application. Specifically, the semiconductor structure includes a substrate 8 having a plurality of first semiconductor fins 10a for a first conductivity semiconductor device, e.g., n-type FinFET, and a plurality of second semiconductor fins 10b for a second conductivity semiconductor device, e.g., p-type FinFET, formed thereupon.

In one embodiment, the semiconductor fins 10a, 10b can be formed from a bulk substrate including a bulk semiconductor material throughout (not shown). In another embodiment and as shown in FIG. 1, the semiconductor fins 10a, 10b and the substrate 8 may be provided from a semiconductor-on-insulator (SOI) substrate, in which the top semiconductor layer of the SOI substrate provides the semiconductor fins 10a, 10b and the buried insulator layer provides the substrate 8. The SOI substrate typically includes, from bottom to top, a handle substrate (not shown), a buried insulator layer (i.e., substrate 8) and a top semiconductor layer (not shown).

The handle substrate may include a semiconductor material, such as, for example, Si, Ge, SiGe, SiC, SiGeC, and III/V compound semiconductors. The handle substrate provides mechanical support to the buried insulator layer 8 and the top semiconductor layer. The thickness of the handle substrate can be from 30 μm to about 2 mm, although less and greater thicknesses can also be employed.

The buried insulator layer may include a dielectric material such as silicon oxide, silicon nitride, silicon oxynitride, or a combination thereof. The thickness of the buried insulator layer can be from 50 nm to 200 nm, with a thickness from 100 nm to 150 nm being more typical.

The top semiconductor layer may include a semiconductor material such as, for example, Si, Ge, SiGe, SiC, SiGeC, and III/V compound semiconductors such as, for example, InAs, GaAs, and InP. The semiconductor materials of the top semiconductor layer and the handle substrate may be the same or different. Typically, each of the handle substrate and the top semiconductor layer comprises a single crystalline semiconductor material, such as, for example, single crystalline silicon. The top semiconductor layer may or may not be doped with p-type dopants and/or n-type dopants. Examples of p-type dopants include, but are not limited to, boron, aluminum, gallium and indium. Examples of n-type dopants, include but are not limited to, antimony, arsenic and phosphorous. The thickness of the top semiconductor layer can be from 10 nm to 200 nm, with a thickness from 30 nm to 70 nm being more typical.

In some embodiments of the present application, a hard mask layer (not shown) can be formed on the top semiconductor layer prior to forming the semiconductor fins. When employed, the hard mask layer may comprise an oxide, nitride, oxynitride or any combination thereof including multilayers. In one embodiment, the hard mask layer includes silicon oxide or silicon nitride. The hard mask layer can be formed utilizing a conventional deposition process such as, for example, chemical vapor deposition (CVD), plasma enhanced chemical vapor deposition (PECVD), chemical solution deposition, evaporation or other like deposition processes. Alternatively, the hard mask layer can be formed by a thermal process such as, for example, oxidation or nitridation of the top semiconductor layer. Any combination of the above mentioned processes can also be used in forming the hard mask layer. The hard mask layer that is formed can have a thickness from 20 nm to 80 nm, with a thickness from 30 nm to 60 nm being more typical.

In one embodiment, the semiconductor fins $10a$, $10b$ can be formed by lithography and etching. The lithographic step includes applying a photoresist layer (not shown) atop the top semiconductor layer (or the hard mask, if present), exposing the photoresist layer to a desired pattern of radiation, and developing the exposed photoresist layer utilizing a conventional resist developer. The etching process comprises dry etching and/or wet chemical etching. Illustrative examples of suitable dry etching processes that can be used in the present application include reactive ion etch (RIE), ion beam etching, plasma etching or laser ablation. Typically, a RIE process is used. The etching process transfers the pattern from the patterned photoresist layer to the top semiconductor layer or first to the hard mask layer, if present, and thereafter to the underlying top semiconductor layer utilizing the buried insulator layer as an etch stop. After transferring the pattern into the top semiconductor layer, the patterned photoresist layer can be removed utilizing a conventional resist stripping process such as, for example, ashing. Alternatively, the semiconductor fins $10a$, $10b$ can also be formed utilizing a sidewall image transfer (SIT) process. In a typical SIT process, spacers are formed on a sacrificial mandrel. The sacrificial mandrel is removed and the remaining spacers are used as a hard mask to etch the top semiconductor layer. The spacers are then removed after the semiconductor fins have been formed.

Each of the semiconductor fins $10a$, $10b$ that is formed may have a height ranging from 5 nm to 150 nm, with a height ranging from 10 nm to 50 nm being more typical. Each of the semiconductor fins $10a$, $10b$ may have a width ranging from 3 nm to 50 nm, with a width ranging from 10 nm to 20 nm being more typical. Adjacent semiconductor fins $10a$, $10b$ may be separated by a pitch ranging from 20 nm to 100 nm, with a pitch ranging from 30 nm to 50 nm being more typical.

In some embodiments of the present application and when the hard mask layer is present, the hard mask layer that remains atop the semiconductor fins $10a$, $10b$ can be removed at this stage. The removal of the remaining non-etched portion of hard mask layer can be achieved by performing a selective etching process or by utilizing a planarization process such as chemical mechanical planarization (CMP). In some embodiments, a portion of the hard mask layer can remain atop each of the semiconductor fins.

Referring to FIGS. 2A-2B, a gate structure is formed over a channel portion of each of the first and the second semiconductor fins $10a$, $10b$. The gate structure transverses (i.e., straddles) the first and the second semiconductor fins $10a$, $10b$. Although only one gate structure is described and illustrated, the present application is not limited to such a number of gate structures. Instead, a plurality of gate structures can be formed straddling each of the first and the second semiconductor fins $10a$, $10b$.

In one embodiment and as shown in FIGS. 2A-2B, the gate structure is a functional gate structure. The term "functional gate structure" as used herein denotes a permanent gate structure used to control output current (i.e., flow of carriers in the channel) of a semiconducting device through electrical fields. The gate structure may include a gate stack and a gate spacer 28 formed on opposite sidewalls of the gate stack. Each gate stack includes, from bottom to top, a gate dielectric 22 located on a top surface and sidewalls of each of first and the second semiconductor fins $10a$, $10b$, an overlying gate conductor 24 and a gate cap 26 atop the gate conductor 24.

The gate structure can be formed by first providing a material stack of a gate dielectric layer, a gate conductor layer and a dielectric cap layer (each of which are not specifically shown) over the semiconductor fins $10a$, $10b$ and the substrate 8.

The gate dielectric layer that provides the gate dielectric 22 of the gate structure can include an oxide, nitride or oxynitride. In one example, the gate dielectric layer can include a high-k material having a dielectric constant greater than silicon dioxide. Exemplary high-k dielectrics include, but are not limited to, $HfO_2$, $ZrO_2$, $La_2O_3$, $Al_2O_3$, $TiO_2$, $SrTiO_3$, $LaAlO_3$, $Y_2O_3$, $HfO_xN_y$, $ZrO_xN_y$, $La_2O_xN_y$, $Al_2O_xN_y$, $TiO_xN_y$, $SrTiO_xN_y$, $LaAlO_xN_y$, $Y_2O_xN_y$, $SiON$, $SiN_x$, a silicate thereof, and an alloy thereof. Each value of x is independently from 0.5 to 3 and each value of y is independently from 0 to 2. In some embodiments, a multilayered gate dielectric structure comprising different gate dielectric materials, e.g., silicon dioxide, and a high-k gate dielectric can be formed.

The gate dielectric layer can be formed by any deposition technique including, for example, chemical vapor deposition (CVD), plasma enhanced chemical vapor deposition (PECVD), physical vapor deposition (PVD), atomic layer deposition (ALD) or sputtering. Alternatively, the gate dielectric layer can also be formed by a thermal growth process such as, for example, oxidation, nitridation or oxynitridation to convert surface portions of the semiconductor fins $10a$, $10b$ into a dielectric material. The gate dielectric layer that is formed can have a thickness ranging from 0.5 nm to 10 nm, with a thickness from 0.5 nm to about 3 nm being more typical.

The gate conductor layer that provides the gate conductor 24 of the gate structure can include any conductive material including, for example, doped polysilicon, an elemental metal (e.g., tungsten, titanium, tantalum, aluminum, nickel, ruthenium, palladium and platinum), an alloy of at least two elemental metals, an elemental metal nitride (e.g., tungsten nitride, aluminum nitride, and titanium nitride), an elemental metal silicide (e.g., tungsten silicide, nickel silicide, and titanium silicide) or multilayered combinations thereof. In some embodiments, the gate conductor material for first semiconductor fins $10a$ is different from the gate conductor material for second semiconductor fins 10b. Different gate conductor materials can be formed by utilizing block mask technology.

The gate conductor layer can be formed utilizing a deposition process including, for example, CVD, PECVD, PVD, ALD, sputtering, or other like deposition processes. In embodiments in which polysilicon or SiGe are used as the gate conductor material, an in-situ deposition process can be used or alternatively deposition followed by ion implantation can be used. The gate conductor layer that is formed can have a thickness ranging from 50 nm to 200 nm, although lesser or greater thicknesses can also be employed.

The dielectric cap layer used in providing the gate cap 26 of the gate structure can be comprised of a dielectric oxide, nitride or oxynitride. In one embodiment of the present application, the dielectric cap layer includes silicon nitride. The dielectric cap layer can be formed by a deposition process including, for example, CVD, PECVD, PVD, ALD or sputtering. The dielectric cap layer that is formed can have a thickness ranging from 25 nm to 100 nm, although lesser or greater thicknesses can also be employed.

The material stack is then patterned and etched to provide the gate stack (22, 24, 26). Specifically, a pattern is produced by applying a photoresist to a topmost surface of the material stack, exposing the photoresist to a pattern of radiation, and then developing the pattern into the photoresist utilizing a resist developer. Once the patterning of the photoresist is completed, the sections of the material stack covered by the photoresist are protected while the exposed regions are removed using a selective etching process that removes the unprotected regions.

Subsequently, the gate spacer 28 is formed on sidewalls of the gate stack (22, 24, 26). The gate spacer 28 can be formed by first depositing a conformal spacer material layer (not shown) on exposed surfaces of the gate dielectric 22, the gate conductor 24, the dielectric cap 26 and the semiconductor fins 10a, 10b utilizing any conventional deposition process including, for example, CVD or ALD. Alternatively, a thermal growth process including oxidation and/or nitridation can be employed in forming the spacer material layer. Following the formation of the conformal spacer material layer, horizontal portions of the conformal spacer material layer are removed by an anisotropic etch, such as, for example, a RIE process. In one embodiment, the RIE process is continued so that vertical portions of the conformal spacer material layer present on the sidewalls of the semiconductor fins 10a, 10b are removed. The remaining vertical portions of the conformal spacer material layer constitute the gate spacer 28.

Materials used to form the gate spacer 28 may include a dielectric oxide, nitride or oxynitride. In one embodiment, the gate spacer 28 is composed of silicon nitride. The gate spacer 28 can have a thickness as measured at the bases ranging from 2 nm to 100 nm, with a thickness ranging from 6 nm to 10 nm being more typical.

In another embodiment, the gate structure is a sacrificial gate structure for a replacement gate process and can be replaced with a function gate structure after forming a source region and a drain region (collectively referred to hereinafter as "source/drain regions") described below.

Figure 3B:
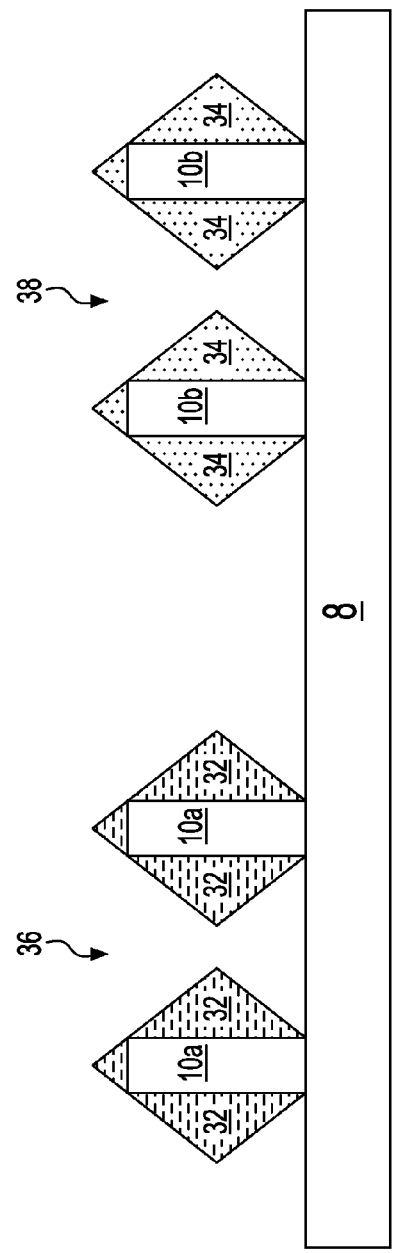
FIG. 3B is a cross-sectional view of the exemplary semiconductor structure of FIG. 3A along line y-y'.

Referring to FIGS. 3A-3B, a first epitaxial semiconductor layer is formed on the top and sidewall surfaces of each of the first semiconductor fins 10a to provide a first epitaxial source region and a first epitaxial drain region (collectively referred to as first epitaxial source/drain regions 32) on opposite sides of the gate structure (22, 24, 26, 28) by a first epitaxial growth process, while a second epitaxial semiconductor layer is formed on the top and sidewall surfaces of each of the second semiconductor fins 10b to provide a second epitaxial source region and a second epitaxial drain region (collectively referred to as second epitaxial source/drain regions 34) on opposite sides of the gate structure (22, 24, 26, 28) by a second epitaxial growth process.

The first epitaxial source/drain regions 32 and the second epitaxial source/drain regions 34 can be formed utilizing block mask technology. A first mask layer (not shown) is first applied over the semiconductor fins 10a, 10b, the gate structure (22, 24, 26, 28) and the substrate and lithographically patterned so that the patterned first mask layer covers the second semiconductor fins 10b, while exposing the first semiconductor fins 10a that would be subjected to the epitaxial deposition and ion implantation. The first mask layer may include any material that can be easily patterned and removed without damaging the underlying components. In one embodiment, the first mask layer includes amorphous carbon with hydrogen content less than about 15 atomic %. The first epitaxial source/drain regions 32 can be formed by epitaxially depositing a first semiconductor material over top and sidewall surfaces of the first semiconductor fins 10a, but not on dielectric surfaces such as the surfaces of the gate cap 26, the gate spacer 26 and the substrate. In one embodiment, the first epitaxial source/drain regions 32 may be composed of Si:C with the strain effect tuned to enhance the performance of n-type FinFETs.

The first semiconductor material of the first epitaxial source/drain regions 32 can be deposited as an intrinsic semiconductor material, or can be deposited with in-situ doping. If the first semiconductor material is deposited as an intrinsic semiconductor material, the first epitaxial source/drain regions 32 can be subsequently doped (ex-situ) with an n-type dopant (e.g., P, As or Sb) utilizing ion implantation, gas phase doping, or dopant out diffusion from a sacrificial dopant source material. After the formation of the first epitaxial source/drain regions 32, the patterned mask layer can be removed, for example, by oxygen-based plasma etching.

The second epitaxial source/drain regions 34 can be formed by performing the processing steps described above with respect to the first epitaxial source/drain regions 32. After forming a patterned second mask layer to cover the first semiconductor fins 10a and expose the second semiconductor fins, a second semiconductor material is epitaxially deposited over top and sidewall surfaces of the second semiconductor fins 10b, but not on dielectric surfaces such as the surfaces of the gate cap 26, the gate spacer 28 and the substrate 8. In one embodiment, the second epitaxial source/drain regions 34 may be composed of SiGe with the strain effect tuned to enhance the performance of p-type FinFETs.

The second semiconductor material of the second epitaxial source/drain regions 34 can be deposited as an intrinsic semiconductor material, or can be deposited with in-situ doping. If the second semiconductor material is deposited as an intrinsic semiconductor material, the second epitaxial source/drain regions 34 can be subsequently doped (ex-situ) with a p-type dopant (e.g., B, Al, Ga or In) utilizing ion implantation, gas phase doping or dopant out diffusion from a sacrificial dopant source material. After the formation of the second epitaxial source/drain regions 34, the patterned second mask layer can be removed, for example, by oxygen-based plasma etching.

In some embodiments of the present application, the epitaxial growth of the silicon-containing semiconductor material can be effected by placing the semiconductor structure into a reaction chamber, and simultaneously, or alternately, flowing at least one silicon source reactant gas (such as $SiH_4$, $Si_2H_6$, $SiH_2Cl_2$, $GeH_4$, $C_2H_2$, $C_2H_4$) and an etchant gas (such as HCl) into the reaction chamber. Optionally, a carrier gas such as $H_2$, $N_2$, $H_2$, and/or Ar can be flowed into the reaction chamber. The temperature for epitaxial deposition typically ranges from 550° C. to 1300° C. The apparatus for performing the epitaxial growth may include a CVD apparatus, such as atmospheric pressure CVD (APCVD), low pressure CVD (LPCVD) and PECVD.

The n-type dopants in the first epitaxial source/drain regions 32 and p-type dopants in the second epitaxial source/drain regions 34 can be activated subsequently using a rapid thermal process. During the activation, dopants within each of the first and the second epitaxial source/drain regions 32, 34 diffuse into a corresponding portion of the semiconductor fins 10a, 10b underlying that epitaxial source/drain region 32, 34 to form a doped region within that semiconductor fin 10a, 10b. Thus, an embedded source/drain region (not shown) is formed underneath each of the first and the second epitaxial source/drain regions 32, 34.

In one embodiment and when top surfaces of the semiconductor fins 10a, 10b have a (100) crystal orientation and sidewall surfaces of the semiconductor fins 10a, 10b have (110) crystal orientation, due to the fact that growth rate on the (111) surfaces is slower than each of that on the (110) surfaces and (100) surfaces, epitaxial deposition results in epitaxial source/drain regions 32, 34 with faceted surfaces. In one embodiment, each of the faceted surfaces of epitaxial source/drain regions 32, 34 can become adjoined to at least another of the faceted surfaces upon completion of the selective epitaxy process and oriented in a direction that is not parallel to, or perpendicular to, a horizontal interface between the semiconductor fins 10a, 10b and the substrate 8. As used herein, a first surface adjoins a second surface when an edge of the first surfaces coincides with an edge of the second surface. The extent of the epitaxial growth is limited to avoid merging of adjacent semiconductor fins 10a, 10b, leaving a first gap 36 between adjacent first epitaxial source/drain regions 32 and a second gap 38 between adjacent second epitaxial source/drain regions 34. As a result, the first epitaxial source/drain regions 32 are isolated from each other by the first gap 36, while the second epitaxial source/drain regions 34 are isolated from each other by the second gap 38.

Figure 4:
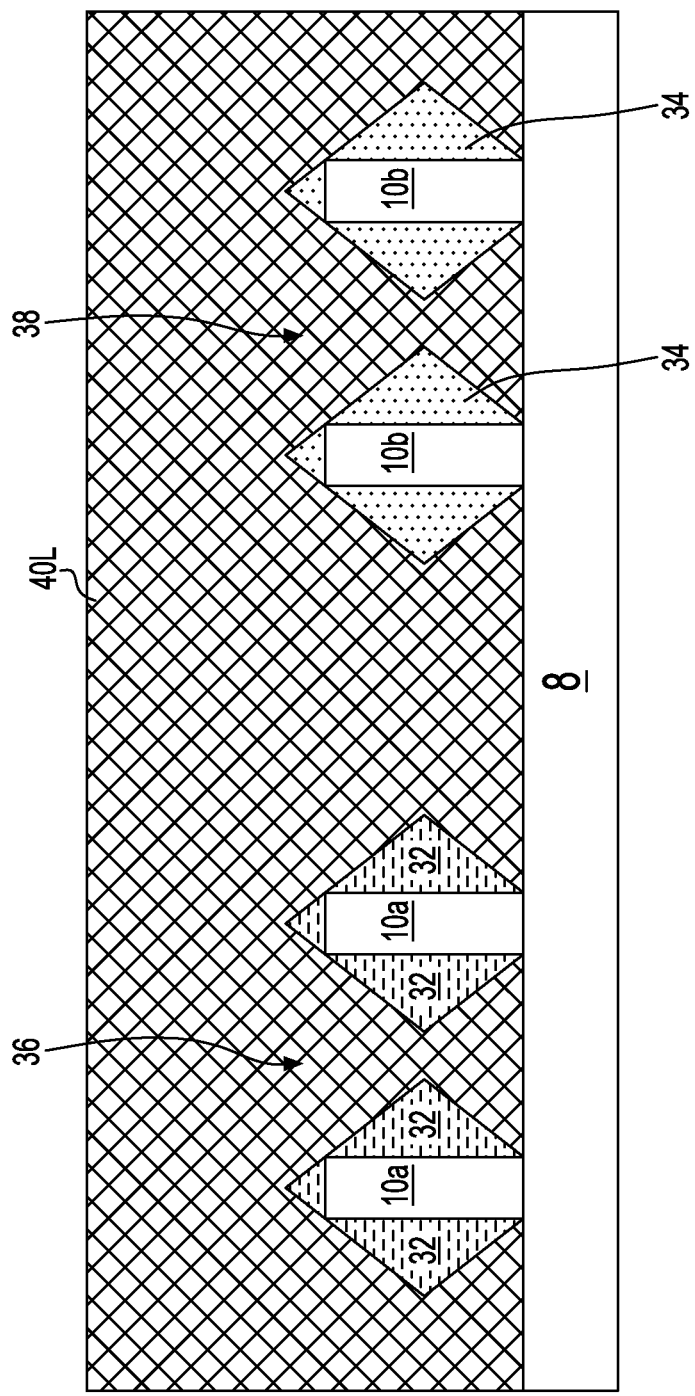
FIG. 4 is a cross-sectional view of the exemplary semiconductor structure of FIGS. 3A-3B after forming an interlevel dielectric (ILD) layer over the substrate to cover the gate structure, the first epitaxial source/drain regions and the second epitaxial source/drain regions.

Referring to FIG. 4, an interlevel dielectric (ILD) layer 40L is formed over the substrate 8, covering the gate structure (22, 24, 26, 28), the first epitaxial source/drain regions 32 and the second epitaxial source/drain regions 34. The ILD layer 40L can include a dielectric material such as undoped silicon oxide, doped silicon oxide, silicon nitride, porous or non-porous organosilicate glass, porous or non-porous nitrogen-doped organosilicate glass, or a combination thereof. The ILD layer 40L can be formed by CVD, PVD or spin coating. If the ILD dielectric layer 40L is not self-planarizing, the top surface of the ILD layer 40L can be planarized, for example, by CMP. The ILD dielectric layer 40L may be planarized to expose the gate structure (22, 24, 26, 28) for a replacement gate process.

Figure 5:
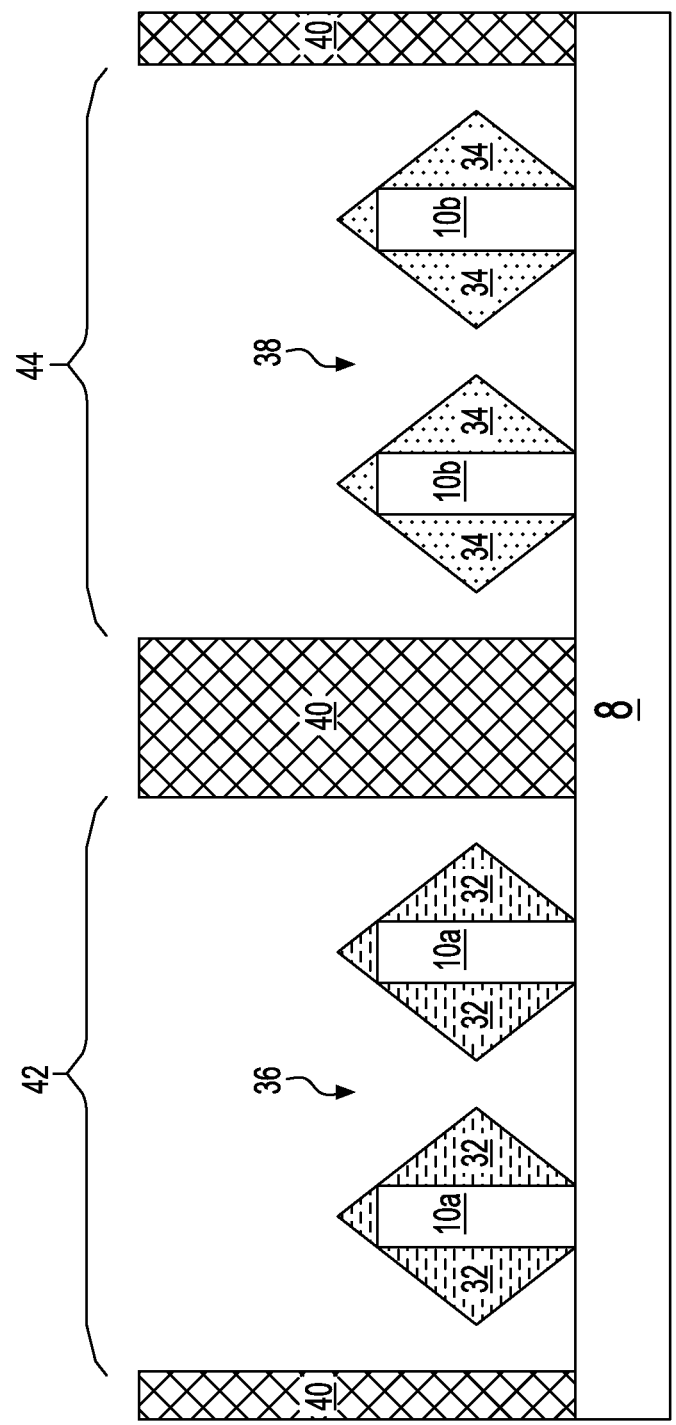
FIG. 5 is a cross-sectional view of the exemplary semiconductor structure of FIG. 4 after forming first source/drain contact openings and second source/drain contact openings through the ILD layer.

Referring to FIG. 5, the ILD layer 40L is then etched to form a pair of first source/drain contact openings 42 on opposite sides of the gate structure (22, 24, 26, 28) in the n-type FinFET region and a pair of second source/drain contact openings 44 on opposite sides of the gate structure (22, 24, 26, 28) in the p-type FinFET region. The first source/drain contact opening 42 extends through the ILD layer 40L to expose the first epitaxial source/drain regions 32 along with portions of the substrate 8 in the n-type FinFET region. The second source/drain contact opening 44 extends through the ILD layer 40L to expose second epitaxial source/drain regions 34 along with portions of the substrate 8 in the p-type FinFET region.

The first and the source/drain contact openings 42, 44 can be formed, for example, by applying a photoresist (not shown) on the top surface of the ILD layer 40L, lithographically patterning openings in the photoresist, and transferring the pattern of the openings in the photoresist through the ILD layer 40L. An anisotropic etch having a chemistry that removes the dielectric materials of the ILD layer 40L selective to the semiconductor materials of the first and the second epitaxial source/drain regions 32, 34 and the dielectric material of the substrate 8 can be employed to transfer the pattern into the ILD layer 40L. After etching, remaining portions of the photoresist layer can be removed by ashing. Remaining portions of the ILD layer 40L are herein referred to as ILD layer portions 40.

Figure 6:
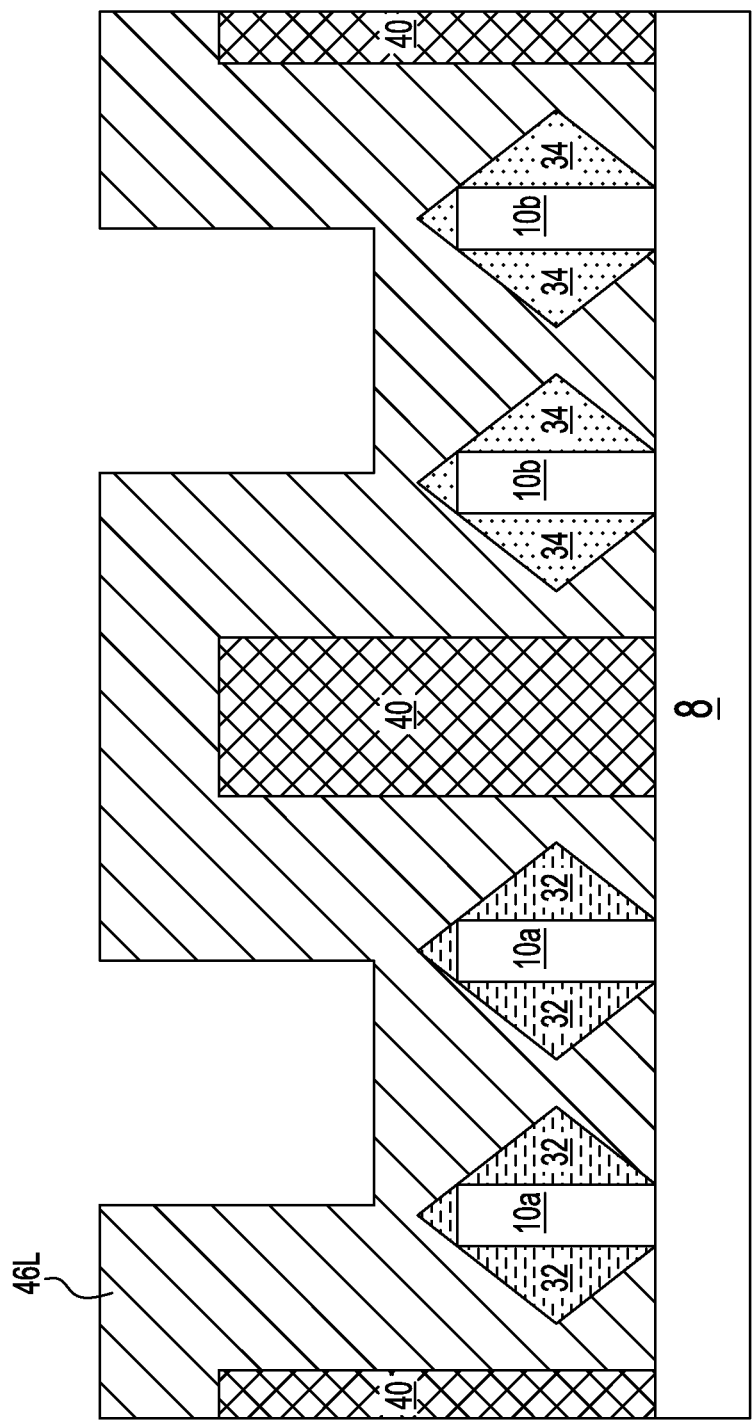
FIG. 6 is a cross-sectional view of the exemplary semiconductor structure of FIG. 5 after forming a contact metal layer in the first and the second source/drain contact openings.

Referring to FIG. 6, a contact metal layer 46L is formed in the first and the second source/drain contact openings 42, 44. In one embodiment, the contact metal layer 46L is deposited over the ILD layer portions 40, the first and the second epitaxial source/drain regions 32, 34 and the substrate 8 that are exposed within the first and the second source/drain contact openings 42, 44 by a conformal deposition process, such as, for example, CVD, PVD or atomic layer deposition (ALD). The contact metal layer 46L is deposited to a thickness sufficient to completely fill the first gap 36 and the second gap 38 and to cover the first and the second epitaxial source/drain regions 32, 34. In one embodiment, the thickness of the contact metal layer 46 can be from 5 nm to 10 nm. The contact metal layer 46L may be composed of a bilayer of titanium (Ti)/titanium nitride (TiN). The Ti layer may be deposited by, for example, PVD and the overlying TiN layer may then be deposited, for example, by ALD.

Figure 7:
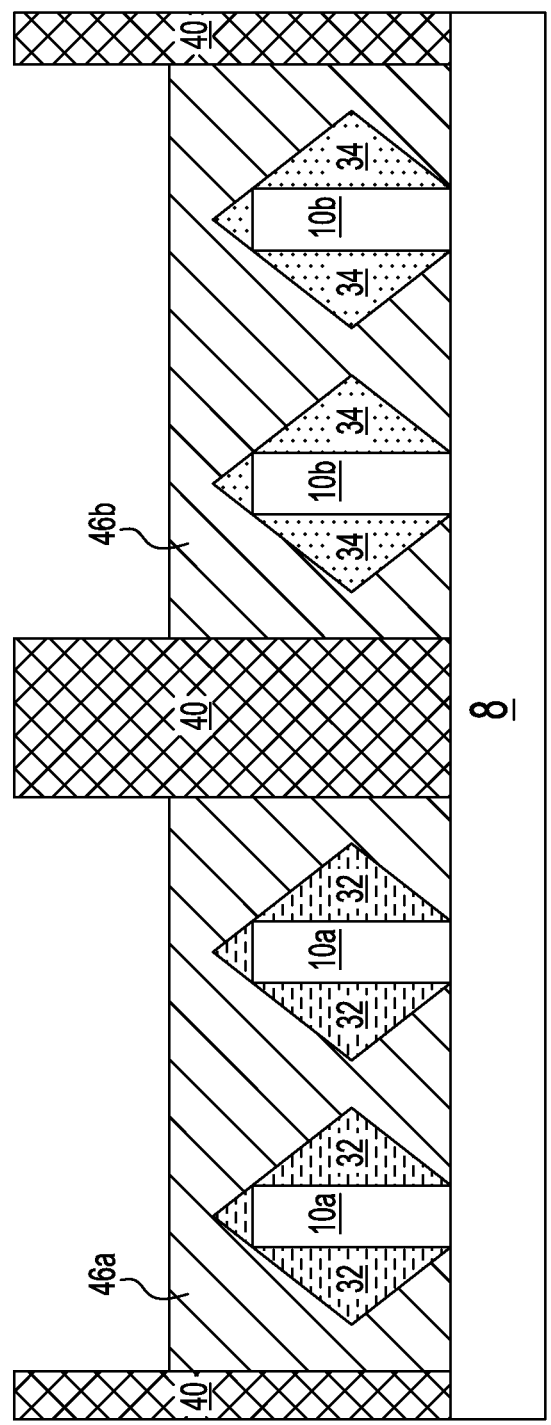
FIG. 7 is a cross-sectional view of the exemplary semiconductor structure of FIG. 6 after recessing the contact metal layer to provide first contact metal layer portions in the first source/drain contact openings and second contact metal layer portions in the second source/drain contact openings.

Referring to FIG. 7, the contact metal layer 46L is recessed such that a recessed surface of the barrier layer 46L is above the top surfaces of the first and the second epitaxial source/drain regions 32, 34 by an etch back process. The etch back process can be a dry etch, such as, for example, RIE. First portions of the remaining portions of the contact metal layer 46L that are located within the first source/drain contact openings 42 are herein referred to as first contact metal layer portions 46a, while second portions of the remaining portions of the contact metal layer 46L that are located within the second source/drain contact openings 44 are herein referred to as second contact metal layer portions 46b.

Figure 8:
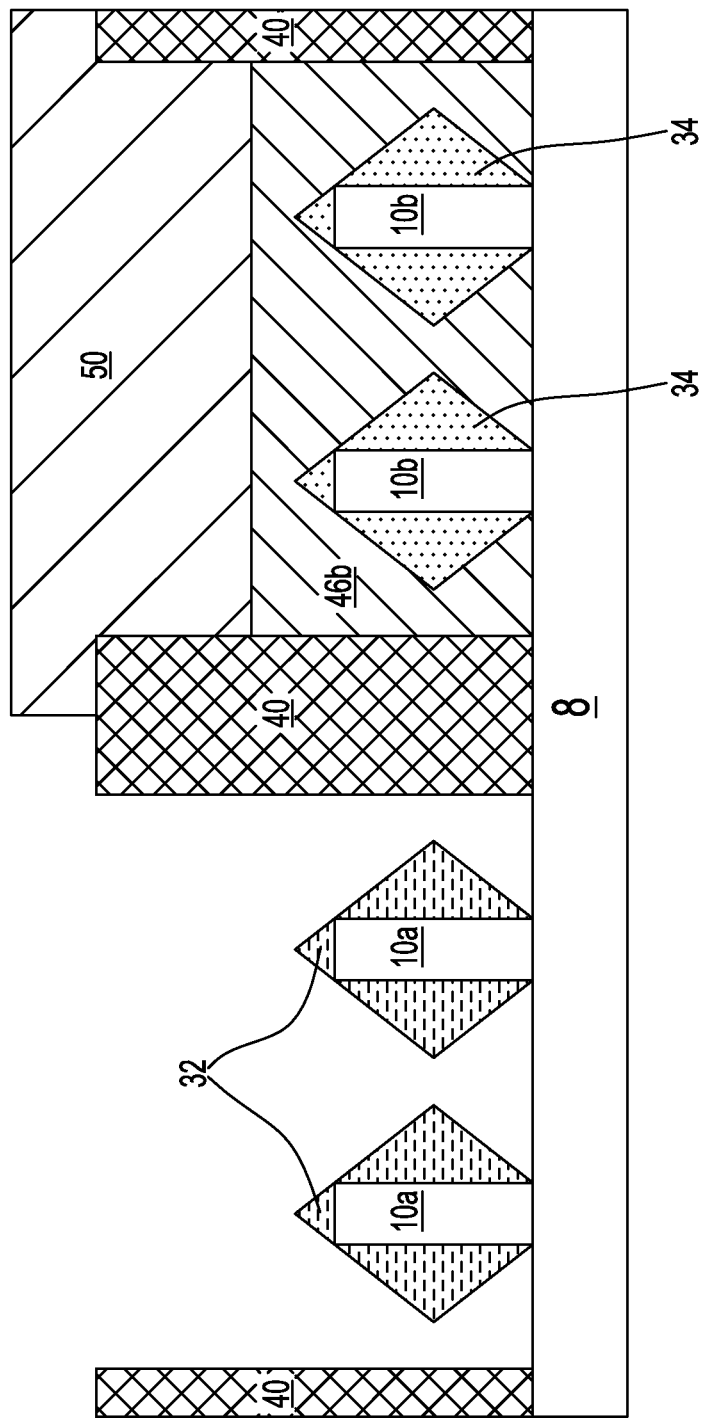
FIG. 8 is cross-sectional view of the exemplary semiconductor structure of FIG. 7 after removing first contact metal layer portions from the first source/drain contact openings.

Referring to FIG. 8, the first contact metal layer portions 46a present in the first source/drain contact openings 42 are removed. A mask layer (not shown) is applied and lithographically patterned so that a patterned mask layer 50 covers the second contact metal layer portion 46b located in the second source/drain contact openings 44, while exposing the first contact metal layer portion 46a located in the first source/drain contact openings 42. The first contact metal layer portions 46a are then removed by an etch, which can be a wet etch or a dry etch. In one embodiment and when the contact metal layer 46L is composed of Ti/TiN, the first contact metal layer portion 46a may be wet etched using a SC1 solution ($H_2O$: $NH_4OH$:$H_2O_2$ mixture). Removal of the first contact metal layer portions 46a re-exposes the first epitaxial source/drain regions 32 in the first source/drain contacts openings 42. The patterned mask layer 50 may then be removed, for example, by oxygen-based plasma etching.

Figure 9:
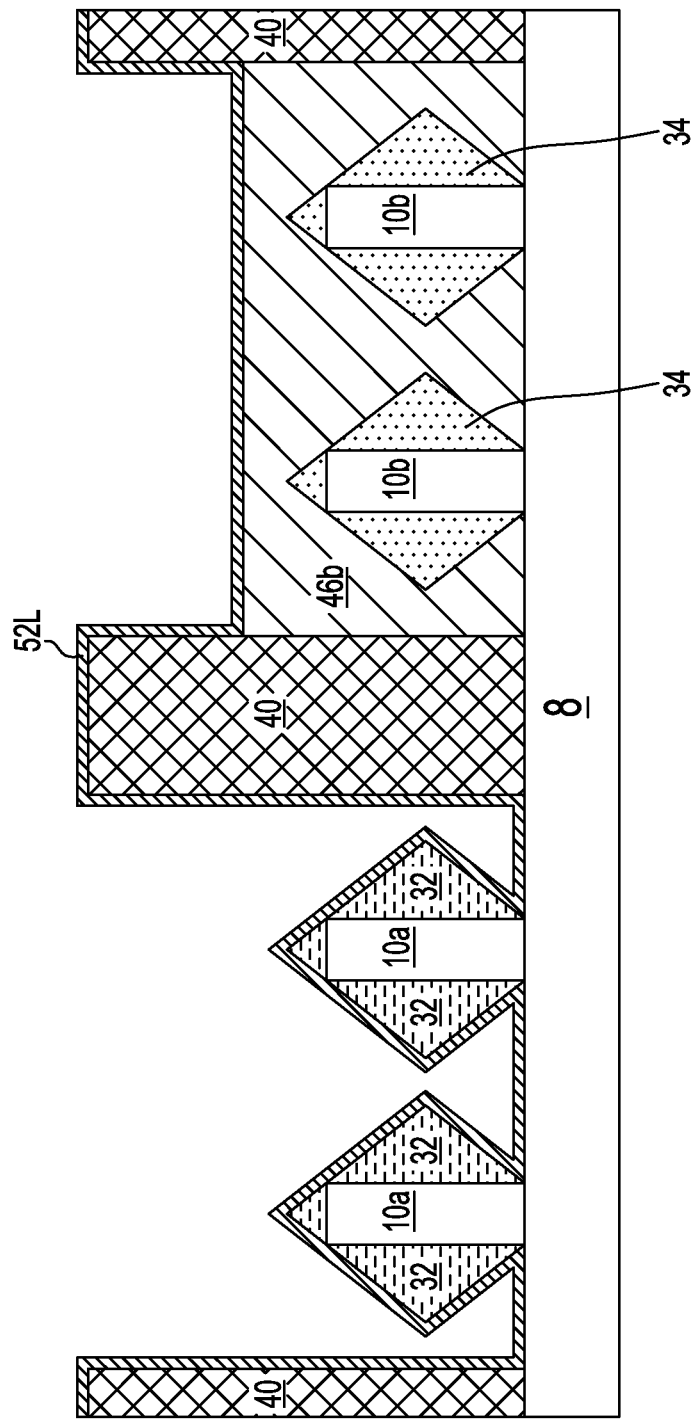
FIG. 9 is a cross-sectional view of the exemplary semiconductor structure of FIG. 8 after forming a conformal contact liner material layer.

Referring to FIG. 9, a conformal contact liner material layer 52L is formed over exposed surfaces of the ILD layer portions 40, exposed surfaces of the first epitaxial source/drain regions 32 and the substrate 8 in the first source/drain contact openings 42, and top surfaces of the second contact metal layer portions 46b in the second source/drain contact openings 44. The contact liner material layer 52L may include titanium, titanium nitride, tantalum, tantalum nitride, nickel, platinum, cobalt, tungsten, rhenium, palladium, erbium, hafnium, lanthanum or their alloys and may be formed utilizing a conformal deposition process including CVD or ALD. The contact liner material layer 52L that is formed can have a thickness ranging from 1 nm to 5 nm. In one embodiment, the contact liner material layer 52L is 2 nm thick.

Figure 10:
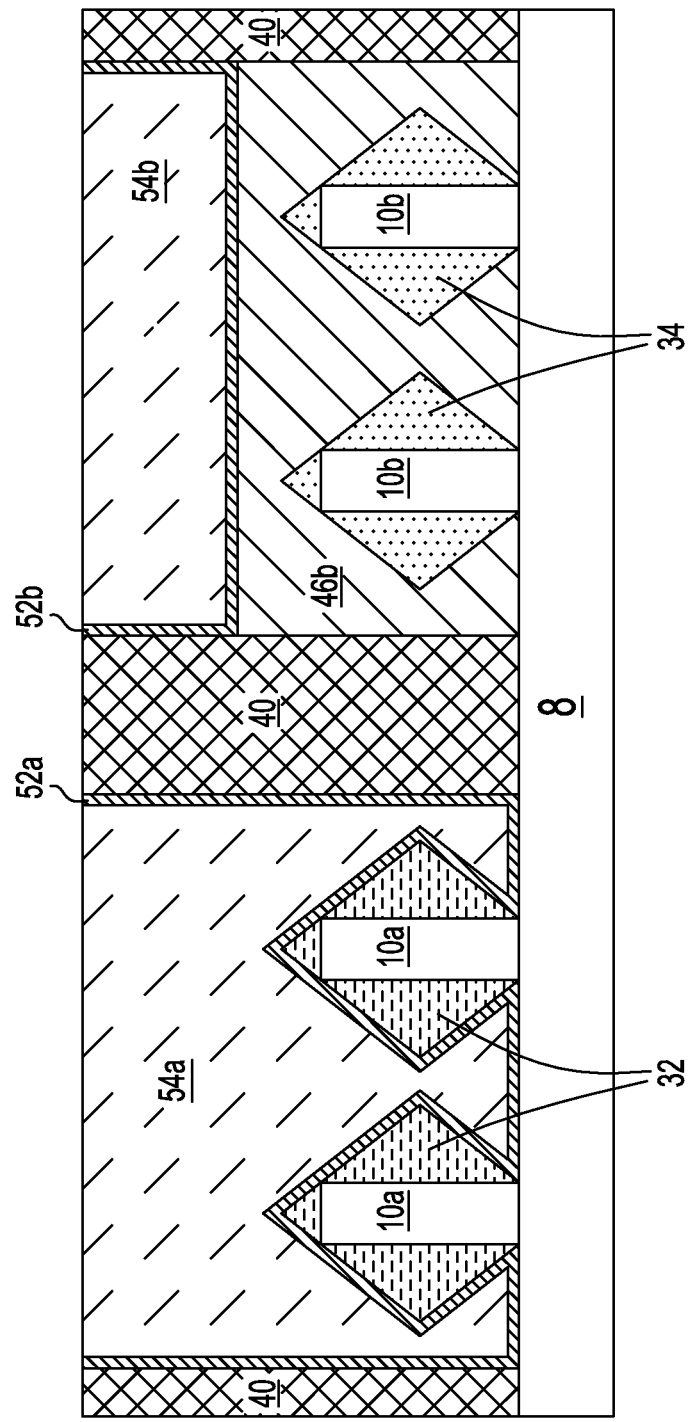
FIG. 10 is a cross-sectional view of the exemplary semiconductor structure of FIG. 9 after forming first source/drain contact structures and second source/drain contact structures.

Referring to FIG. 10, a conductive fill material layer (not shown) is deposited in the remaining portions of the source/drain contact openings 42, 44 until the source/drain contract openings 42, 44 are completely filled. The conductive fill material layer may include a metal such as, for example, tungsten, aluminum, copper or their alloys. The conductive fill material layer can be formed by any suitable deposition method such as, for example, CVD, PVD or plating.

The contact liner material layer 52L and conductive fill material layer are then planarized utilizing any conventional processes such as, for example, CMP or RIE, where the ILD layer portions 40 are used as an etch stop. Remaining portions of the contact liner material layer 52L in the first source/drain contact openings 42 constitute first contact liner 52a, remaining portions of the contact liner material layer 52L in the second source/drain contact openings 44 constitute second contact liner 52b, remaining portions of the conductive fill material layer in the first source/drain contact openings 42 constitute first conductive plug 54a, and remaining portions of the conductive fill material layer in the second source/drain contact openings 44 constitute second conductive plug 54b.

Thus, a pair of first source/drain contact structures is formed within the first source/drain contact openings 42 in the n-type FinFET region. The first source/drain contact structure (52a, 54a) wraps around each of the first epitaxial source/drain regions 32 by conforming to upper and lower surfaces of the first epitaxial source/drain region 32. A pair of second source/drain contact structures is formed within the second source/drain contact openings 44 in the p-type FinFET region. The second source/drain contact structure (46b, 52b, 54b) wraps around each of the second epitaxial source/drain regions 34 by conforming to upper and lower surfaces of the second epitaxial source/drain regions 34.

In the n-type FinFET region, each of the first source/drain contact structure (52a, 54a) includes a first contact liner 52a present on sidewalls and a bottom surface of the first source/drain contact opening 42 and on the upper and lower surfaces of the first epitaxial source/drain regions 32, and a first conductive plug 54a present on the first contact liner 52a. The first conductive plug 54a completely fills the first gap 36 between the first epitaxial source/drain regions 32 and encapsulates the first epitaxial source/drain regions 32. Since the first source/source contact structures are formed on the first epitaxial source/drain regions 32 in a wrap-around configuration, thereby establishing contact to entire first epitaxial source/drain regions 32, the source/drain contact area is advantageously increased in the n-type FinFET region.

In the p-type FinFET region, each second source/drain contact structure (46b, 52b, 54b) includes a second contact metal layer portion 46b present in a lower portion of the second source/drain contact opening 44 and covering the second source/drain regions 38, a second contact liner 52b present on sidewalls of the second source/drain contact opening 44 and a top surface of the second contact metal layer portion 46b and a second conductive plug 54b present on the second contact liner 52b. The second contact metal layer portion 46b completely fills the second gap 38 between the second epitaxial source/drain regions 34 and encapsulates the second epitaxial source/drain regions 34. The second conductive plug 54b thus is located at a top portion of the second source/drain contact openings 44 above the second epitaxial source/drain regions 34. Since the second source/source contact structures are formed on the second epitaxial source/drain regions 34 in a wrap-around configuration, thereby establishing contact to entire second epitaxial source/drain regions 34, the source/drain contact area is advantageously increased in the p-type FinFET region.

The wrap-around configurations of the first source/drain contact structures (52a, 54a) and the second/drain contact structures (46b, 52b, 54b) of the present application also allow to create a differential stress on n-type FinFETs and p-type FinFETs because the first conductive plug 54a encapsulated the first epitaxial source/drain regions 32 may impart a desirable stress on the n-type FinFETs, but as there is no such conductive plug encapsulates the second epitaxial source/drain regions 34, no equivalent stress is imparted on the p-type FinFETs. As a result, the performances of the n-type FinFETs and p-type FinFETs can be improved simultaneously.

In some embodiments of the present application, to avoid damages to the epitaxially deposited semiconductor materials of the first and the second epitaxial source/drain regions 32, 34 due to the contact over-etch during the formation of the source/drain contact openings 42, 44, before forming the ILD layer 40L, a nitride cap layer may be formed on the first and the second epitaxial source/drain regions 32, 34 to protect the first and the second source/drain regions during the etching processes. The processes of forming such nitride cap layer are illustrated and described in FIGS. 11-18. As shown in FIGS. 11-18, the semiconductor structure includes three sacrificial gate structures (122, 124, 126, 28). Each of the sacrificial gate structures includes a sacrificial gate stack and a spacer 28 formed on opposite sidewalls of the sacrificial gate stack. Each of the gate stacks includes, from bottom to top, a sacrificial gate dielectric 122, a sacrificial gate conductor 124 and a sacrificial gate cap 126. The sacrificial gate structures can be formed using the processing steps of FIGS. 2A-2B. Exemplary materials that can be used as sacrificial gate dielectric 122 include, but are not limited to, silicon oxide, silicon nitride, or silicon oxynitride. Exemplary materials that can be used as sacrificial gate conductor 124 include, but are not limited to, polysilicon or a silicon-containing semiconductor alloy such as a silicon-germanium alloy. Exemplary materials that can be used as sacrificial gate cap 126 include, but are not limited to, silicon nitride or silicon oxide.

Referring to FIGS. 11A-11B, a nitride cap layer 60L is deposited over the sacrificial gate structures (122, 124,126, 28), the first and the second epitaxial source/drain regions 32, 34 and exposed surfaces of the substrate 8 of FIGS. 3A-3B. The nitride cap layer 60 is deposited as a single contiguous layer which contacts all sidewalls of the sacrificial gate structures (122, 124. 126, 28) and top surfaces of the sacrificial gate caps 126. The nitride cap layer 60L also contacts upper and lower surfaces of the first and the second epitaxial source/drain regions 32, 34 and exposed surfaces of the substrate 8.

The nitride cap layer 60L, which has a good etch resistance to protect the first and the second epitaxial source/drain regions 32, 34 from any damage during subsequent etching of the ILD layer 40L in the formation of source/drain contact openings, may be composed of titanium nitride or tantalum nitride. The nitride cap layer 60L may be deposited by a conformal deposition method such as, for example, CVD or ALD and may have a thickness ranging from 3 nm to 30 nm, although lesser and greater thicknesses can also be employed.

Referring to FIGS. 12A-12B, an organic planarization layer (OPL) (not shown) is formed over the nitride cap layer 60L to cover the sacrificial gate structures (122, 124, 126, 28) and the first and the second epitaxial source/drain regions 32, 34. The OPL may include a flowable oxide or amorphous carbon to fill the gaps between the sacrificial gate structures (122, 124, 126, 28) and the first and the second epitaxial source/drain regions 32, 34. Following the deposition of the OPL, the OPL can be planarized, for example, by CMP using topmost surfaces of the nitride cap layer 60L as an etch stop so that a top surface of the ILD layer 30 is coplanar with the topmost surfaces of the nitride liner layer 60L.

The OPL is then recessed to provide OPL portions 62. An etch back process, such as, for example, RIE, can be performed to removes an upper portion of the OPL selectively to the nitride cap layer 60L. The recessing depth is controlled such that the OPL portions 62 have a height great enough to cover the first and the second epitaxial source/drain regions 32, 34. Portions of the nitride cap layer 60L that are located on the top surfaces of the sacrificial gate caps 26 and upper portions of sidewalls of the gate structures (122, 124, 126, 28) are thus exposed.

Referring to FIGS. 13A-13B, portions of the OPL portions 62 that are presented at the boundary of the n-type FinFET region and p-type FinFET region are removed to form gaps 66 between the first epitaxial source/drain regions 32 and the second epitaxial source/drain regions 34. The gaps 66 expose portions of horizontal portions of the nitride cap layer 60L located at the boundary of the n-type FinFET region and p-type FinFET region. Remaining portions of the OPL portions 62 are herein referred to as patterned OPL portions 64.

Figure 14A:
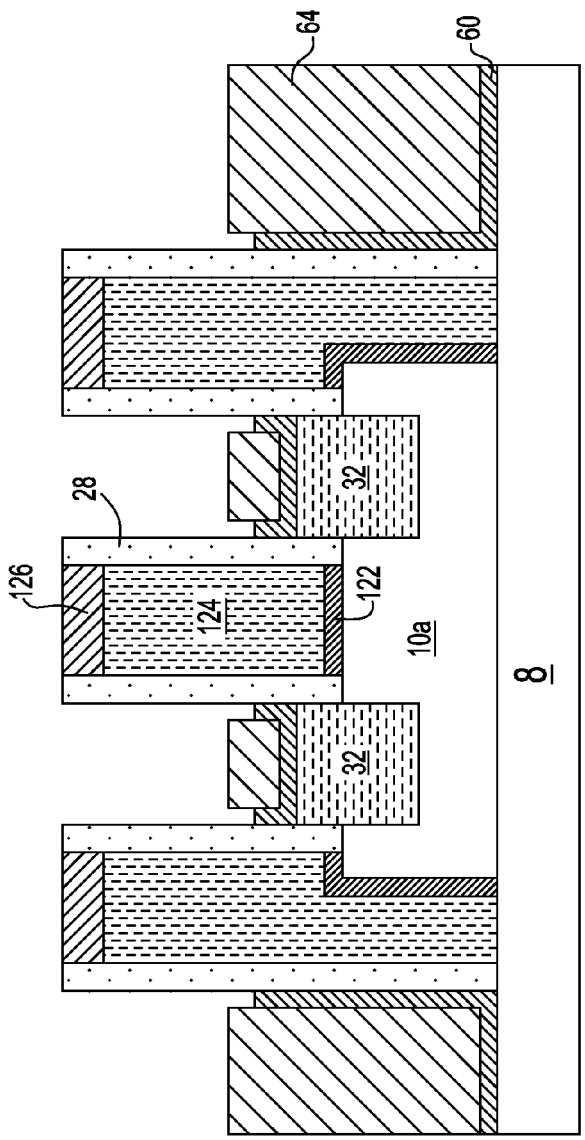
FIGS. 14A-14B are cross-sectional views of the exemplary semiconductor structure of FIGS. 13A-13B after removing portions of the nitride cap layer that are exposed by the OPL portions to provide nitride cap layer portions and subsequently removing the OPL portions.
Figure 14B:
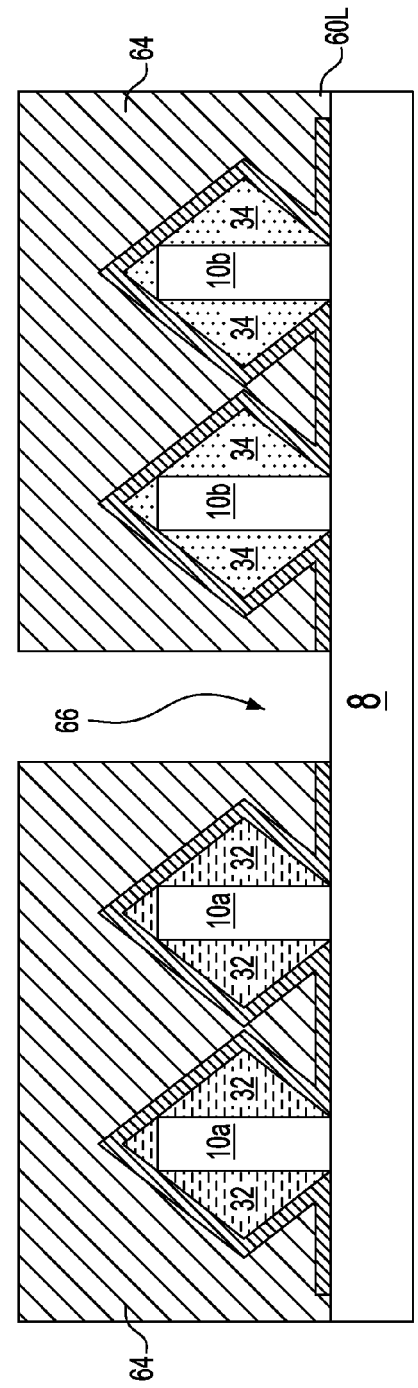

Referring to FIGS. 14A-14B, portions of the nitride cap layer 60L that are not covered by the patterned OPL portions 64 are removed by at least one etch. For example, portions of horizontal portions of the nitride cap layer 60L that are not covered by the pattern OPL portions 64 (i.e., portions of the pattern OPL portions on the top surfaces of the sacrificial gate cap 126 and at the boundary of the n-type FinFET region and p-type FinFET region) may be first removed by an anisotropic etch, such as, for example, RIE. Subsequently, portions of vertical portions of the nitride cap layer 60 that are located on the upper portions of sidewalls of the sacrificial gate structures (122, 124, 216, 28) may be removed using an isotropic etch. Remaining portions of the nitride cap layer 60L are herein referred to as nitride cap layer portions 60. The removal of portions of the nitride cap layer 60L from the gaps 66 electrically isolates the first epitaxial source/drain regions 32 from the second epitaxial source/drain regions 34.

After removing portions of the nitride cap layer 60L, the patterned OPL portions 64 may be removed by dry etching or chemical wet etching to expose nitride cap layer portions 60. In one embodiment, the patterned OPL portions 64 can be removed by sulfuric acid.

Referring to FIGS. 15A-15B, the process steps of FIG. 4 are performed to form an ILD layer 40L. The ILD layer 40L covers the sacrificial gate structures (122, 124, 126, 28), the nitride cap layer portions 60 and exposed surfaces of the substrate 8 and has a top surface coplanar with the top surfaces of the sacrificial gate cap 126.

Referring to FIGS. 16A-16B, the sacrificial gate stacks (122, 124, 126) are removed to provide gate cavities (not shown). The sacrificial gate stacks (122, 124, 126) can be removed selectively to the substrate 8, the semiconductor fins 10a, 10b, the gate spacer 28 and the ILD layer 40L by at least one etch. The at least one etch can be a wet chemical etch such as an ammonia etch or a dry etch such as RIE. The gate cavity occupies a volume from which each sacrificial gate stack (122, 124, 126) is removed and is laterally confined by inner sidewalls of the gate spacer 28.

Subsequently, functional gate stacks are formed in the gate cavities. Each of the functional gate stacks includes a gate dielectric 72, a gate conductor 74 and a gate cap 76. The functional gate stacks (72, 74, 76) can be formed by first depositing a conformal dielectric layer (not shown) on bottom surfaces and sidewalls of the gate cavities and to the top surface of the ILD layer 40L. The conformal dielectric layer may include a high-k dielectric material as described above in FIGS. 2A-2B. Remaining volumes of the gate cavities are then filled with a gate conductor layer (not show) including a conductive material as described above in FIGS. 2A-2B.

The portion of the gate conductor layer formed above the top surface of the ILD layer 40L can be removed, for example, by CMP. The portion of the gate dielectric layer that is formed above the top surface of the ILD layer 40L may also be subsequently removed. In some embodiments and as illustrated, the remaining portions of the gate conductor layer and the remaining portions of the gate dielectric layer may be recessed utilizing a dry etch or a wet chemical etch to provide a void (not shown) in each of the gate cavities. The recessed portions of the gate conductor layer constitute gate conductor 74, and the recessed portions of the gate dielectric layer constitute gate dielectric 72.

A gate cap material (e.g., dielectric material described in FIGS. 2A-2B) is then deposited over the gate dielectric 72 and the gate conductor 74 in the gate cavities to fill voids that are formed after recessing the remaining portions of the gate conductor layer and the remaining portions of the gate dielectric layer. Following the deposition of the gate cap material, the deposited gate cap material can be subsequently planarized, for example, by CMP using the top surface of the ILD layer 40 as an etch stop to provide the gate cap 76.

Referring to FIGS. 17A-17B, the processing steps of FIG. 5 are performed to form first and second source/drain contact openings 42, 44. The first source/drain contact openings 42 expose first epitaxial source/drain regions 32, while the second source/drain contact openings 44 expose second epitaxial source/drain regions 34. Since the nitride cap layer portions 60 have a good etch resistance to the etch chemistries that are employed to form the first and the second source/drain contact openings 42, 44, the nitride cap layer portions 60 act as an etch stop to prevent damages to the semiconductor materials of the first and second epitaxial source/drain regions 32, 34 during the etch processes.

Referring to FIGS. 18A-18B, portions of the nitride cap layer portions 60 that are exposed in the first and second source/drain contact openings 42, 44 are removed selectively to the first and the second epitaxial source/drain regions 32, 34, the gate spacer 28 and the substrate 8, while remaining portions of the nitride cap layer portion 60 that are presented on sidewalls of the outermost gate structures (72, 74, 76, 28) remain intact.

Subsequently, the processing steps of FIGS. 4-10 are performed to form source/drain contact structures (not shown) with increased contact areas for the first and second epitaxial source/drain regions 32, 34.

While the present application has been particularly shown and described with respect to various embodiments thereof, it will be understood by those skilled in the art that the foregoing and other changes in forms and details may be made without departing from the spirit and scope of the present application. It is therefore intended that the present application not be limited to the exact forms and details described and illustrated, but fall within the scope of the appended claims.

What is claimed is:

1. A semiconductor structure comprises:
a plurality of first semiconductor fins located on a first region of a substrate, wherein each of the plurality of first semiconductor fins has a channel region disposed between a pair of first epitaxial source/drain regions, wherein adjacent first epitaxial source/drain regions are separated by a first gap;
a plurality of second semiconductor fins located on a second region of the substrate, wherein each of the plurality of second semiconductor fins has a channel region disposed between a pair of second epitaxial source/drain regions, wherein adjacent epitaxial second source/drain regions are separated by a second gap;
a gate structure overlying the channel portion of each of the plurality of first semiconductor fins and the plurality of second semiconductor fins;
a pair of first source/drain contact structures electrically coupled to the first epitaxial source/drain regions located on either side of the gate structure, wherein each of the first source/drain contact structures comprises at least a first conductive plug encapsulating the first epitaxial source/drain regions on one side of the gate structure and in contact with all surfaces of the epitaxial first source/drain regions; and
a pair of second source/drain contact structures electrically coupled to the second epitaxial source/drain regions located on either side of the gate structure, wherein each of the second source/drain contact structures comprises at least a contact metal layer portion encapsulating the second epitaxial source/drain regions on one side of the gate structure and in contact with all surfaces of the second epitaxial source/drain regions and a second conductive plug located on a top surface of the contact metal layer portion.

2. The semiconductor structure of claim 1, wherein the first region is a n-type fin field effect transistor (FinFET) region, and wherein the second region is a p-type FinFET region.

3. The semiconductor structure of claim 1, wherein the surfaces of each of the first and the second epitaxial source/drain regions are faceted surfaces.

4. The semiconductor structure of claim 1, wherein the first epitaxial source/drain regions comprises Si:C, and wherein the second epitaxial source/drain regions comprises SiGe.

5. The semiconductor structure of claim 1, wherein each of the first conductive plug and the second conductive plug is selected from a group consisting of tungsten, aluminum, copper and an alloy thereof.

6. The semiconductor structure of claim 1, wherein each of the first source/drain contact structures further comprises a first contact liner underlying the first conductive plug, the first contact liner in contact with sidewalls and a bottom surface of the first source/drain contact opening and all the surfaces of the first epitaxial source/drain regions, and wherein each of the second source/drain contact structures further comprises a second contact liner underlying the second conductive plug, the second contact liner in contact with upper portions of sidewalls of the second source/drain contact opening and the top surface of the contact metal layer portion.

7. The semiconductor structure of claim 6, wherein each of the first contact liner and the second contact liner is selected from a group consisting of titanium, titanium nitride, tantalum, tantalum nitride, nickel, platinum, cobalt, tungsten, rhenium, palladium, erbium, hafnium, lanthanum and an alloy thereof.

* * * * *